(12) United States Patent
Shibamoto et al.

(10) Patent No.: US 6,740,209 B2
(45) Date of Patent: May 25, 2004

(54) MULTILAYER FILM DEPOSITION APPARATUS, AND METHOD AND APPARATUS FOR MANUFACTURING PERPENDICULAR-MAGNETIC-RECORDING MEDIA

(75) Inventors: Masahiro Shibamoto, Tokyo (JP); Shinji Furukawa, Tokyo (JP); Tetsuya Endoh, Tokyo (JP); Miho Sakai, Tokyo (JP); Naoki Watanabe, Tokyo (JP)

(73) Assignee: Anelva Corporation, Tokyo (JP)

( * ) Notice: Subject to any disclaimer, the term of this patent is extended or adjusted under 35 U.S.C. 154(b) by 0 days.

(21) Appl. No.: 10/205,604

(22) Filed: Jul. 26, 2002

(65) Prior Publication Data

US 2003/0019739 A1 Jan. 30, 2003

(30) Foreign Application Priority Data

Jul. 27, 2001 (JP) ......................................... 2001-228124

(51) Int. Cl.[7] .......................... C23C 14/34; C23C 14/35
(52) U.S. Cl. ............................. 204/192.12; 204/298.11; 204/298.2; 204/298.23; 204/298.26; 204/298.28
(58) Field of Search .................. 204/192.12, 298.06, 204/298.11, 298.17, 298.2, 298.22, 298.23, 298.26, 298.28

(56) References Cited

U.S. PATENT DOCUMENTS

| | | | | |
|---|---|---|---|---|
| 6,083,364 A | * | 7/2000 | Ikeda et al. ............. | 204/298.11 |
| 6,290,826 B1 | * | 9/2001 | Obinata et al. ......... | 204/298.28 |
| 6,399,173 B1 | * | 6/2002 | Nagayama et al. ........ | 428/64.1 |

* cited by examiner

Primary Examiner—Steven Versteeg
(74) Attorney, Agent, or Firm—Kanesaka & Takeuchi

(57) ABSTRACT

This application discloses a multi-layer film deposition apparatus comprising; plural cathodes comprising targets respectively, a main rotation mechanism for rotating each cathode together, and a substrate holder to hold a substrate onto which a multi-layer film is deposited by sputtering. The targets are arranged at positions where their center axes are on a circumference. The main rotation mechanism rotates the cathodes around the axis in common to the circumference. The substrate is located at a position within an area in view to the direction of the axis. The area is formed of two loci of points on the rotated targets. One of the locus is drawn by the point nearest to the axis, and the other locus is drawn by the point furthest from the axis.

21 Claims, 13 Drawing Sheets

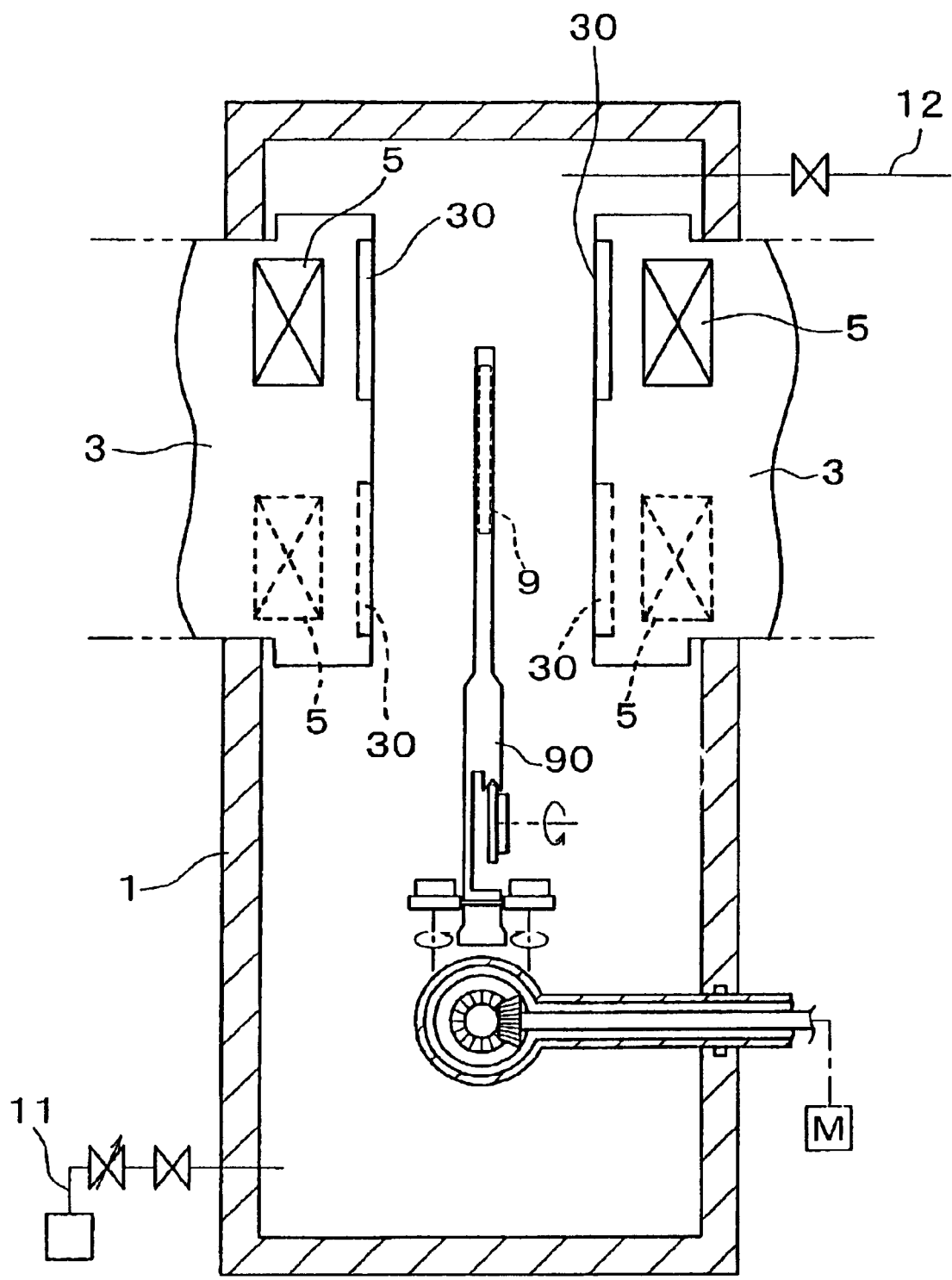
F I G. 1

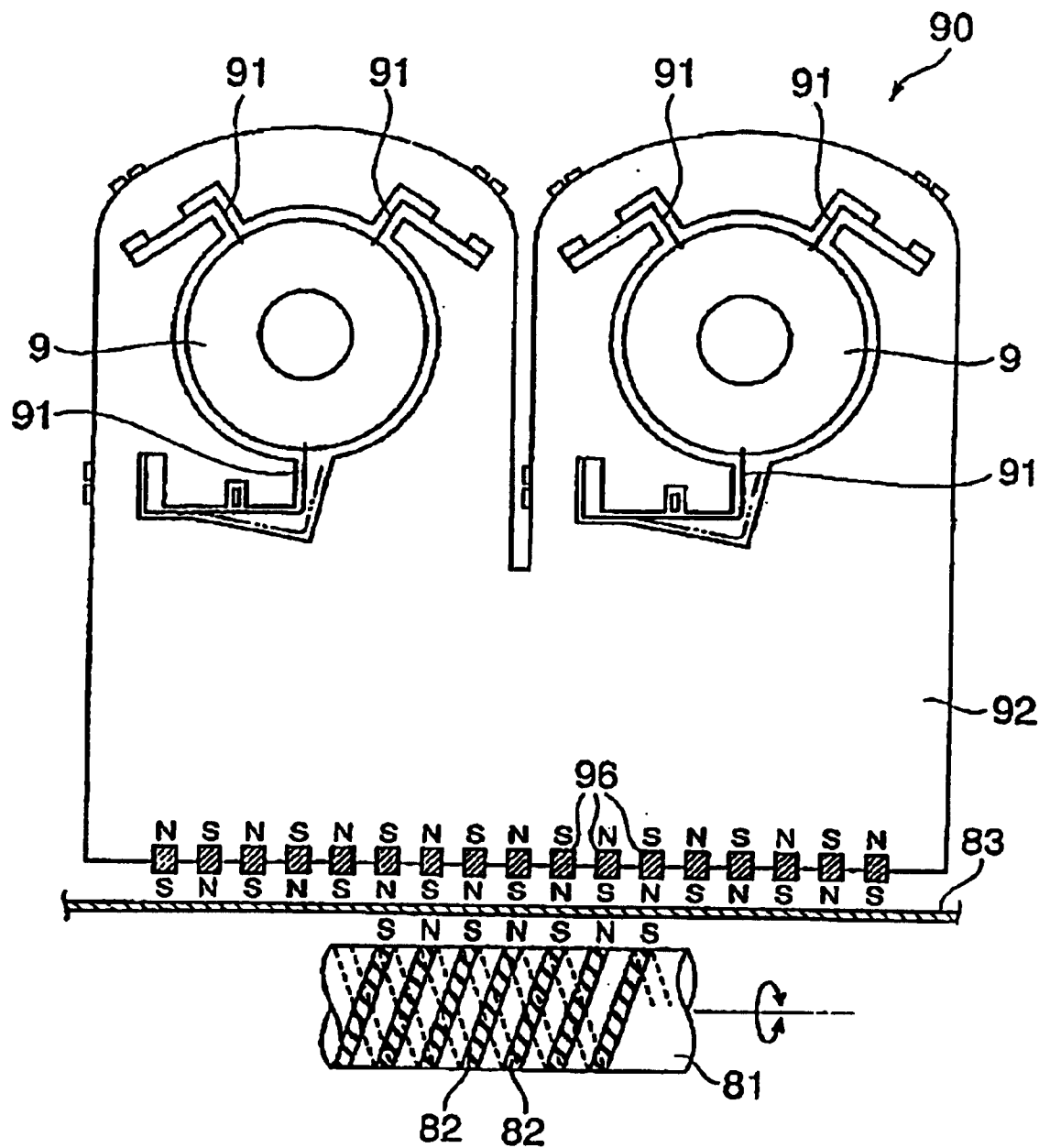
F I G. 2

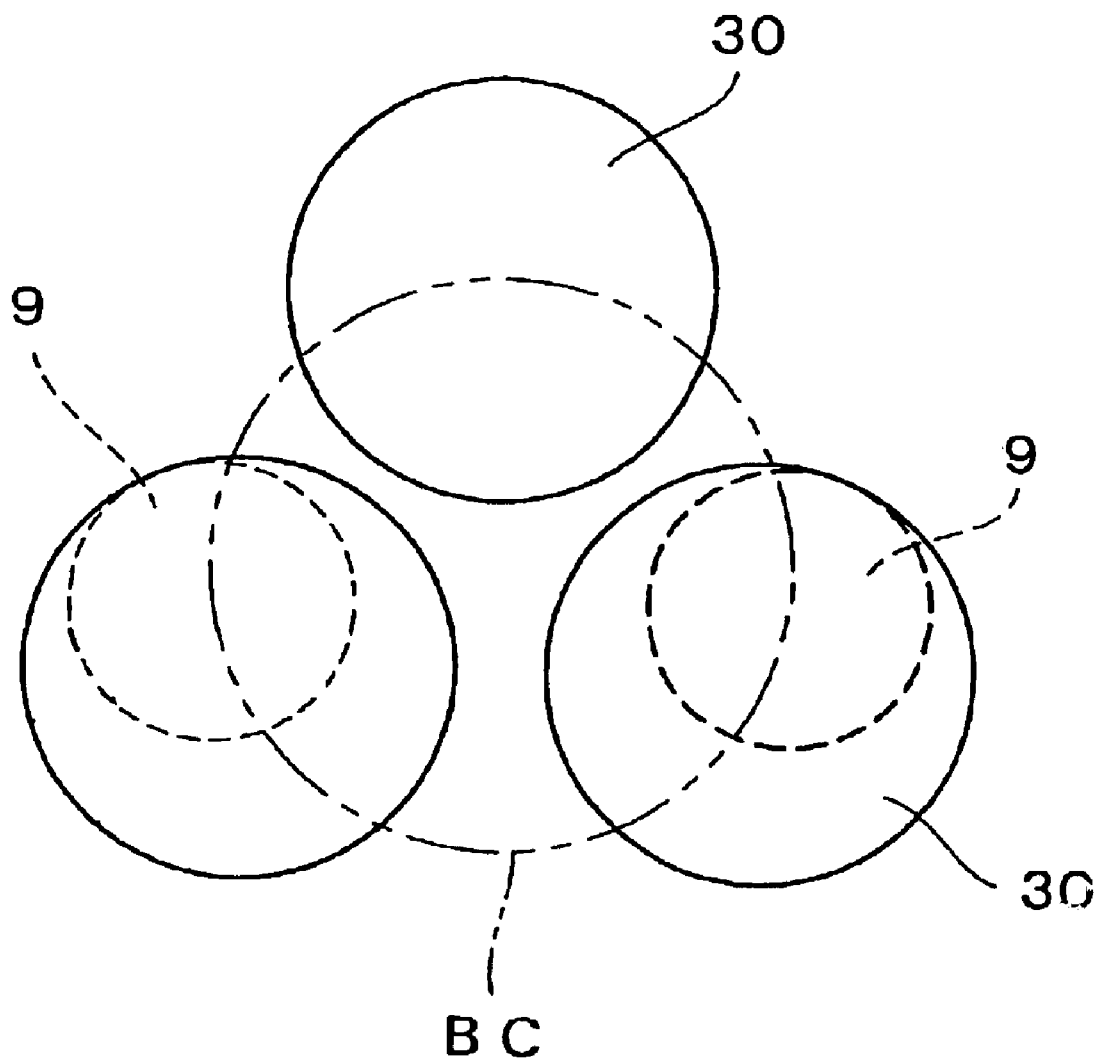
F I G. 7

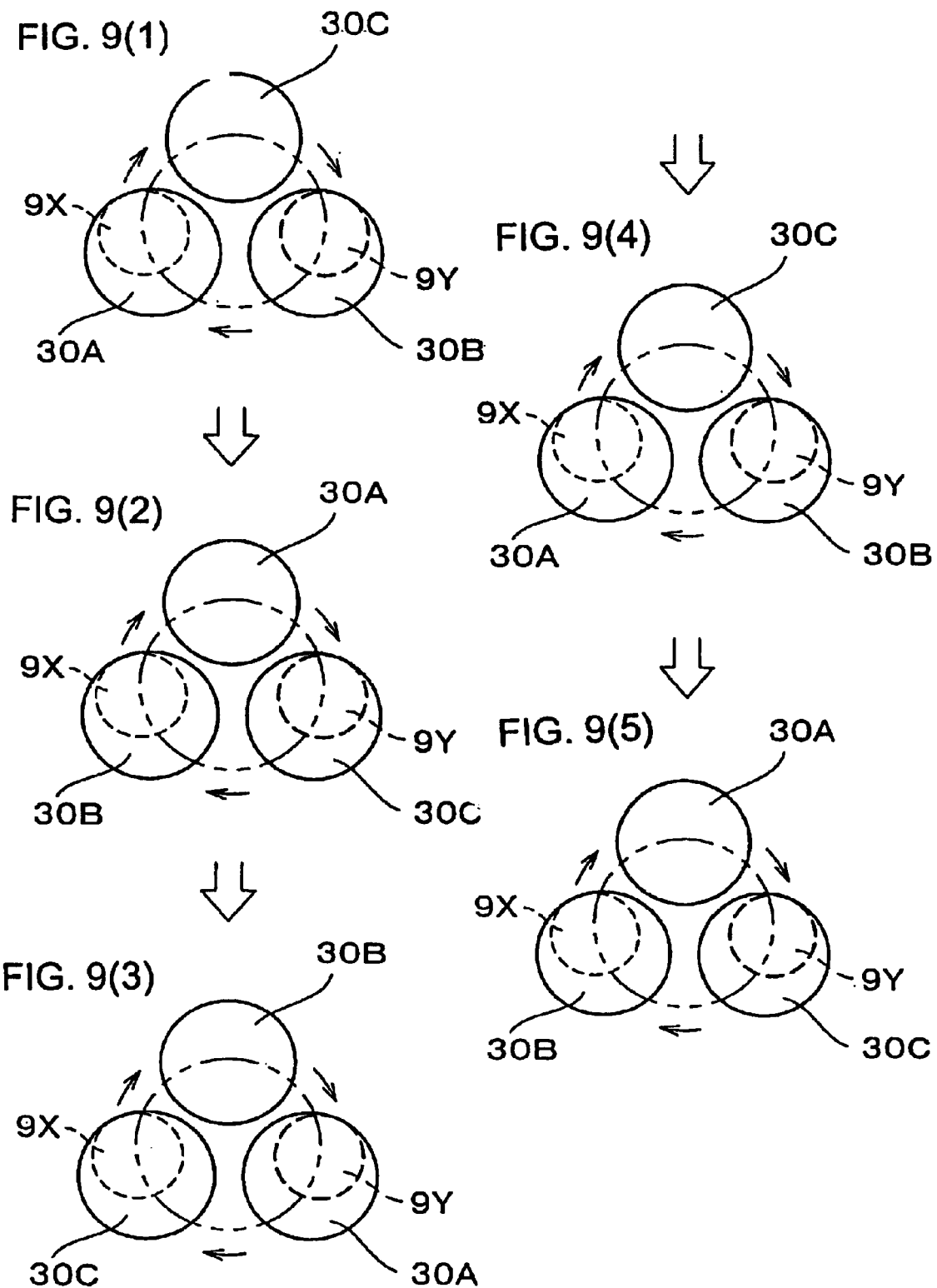

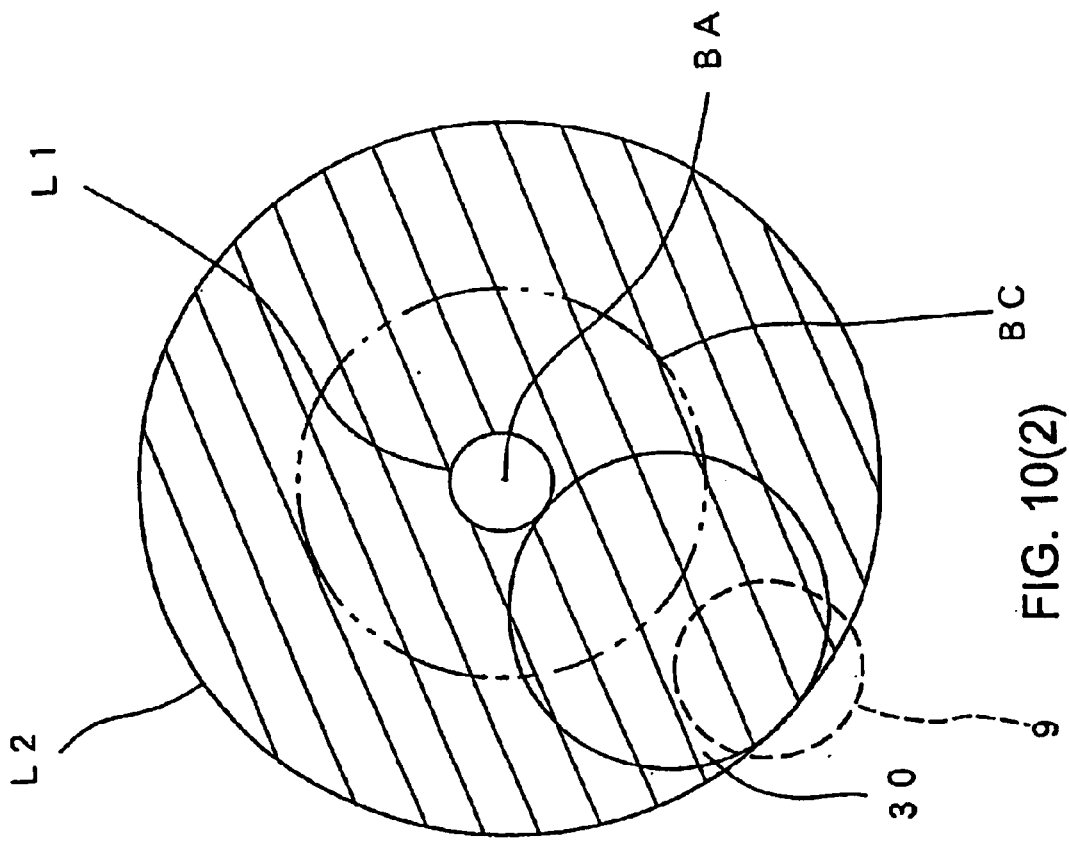
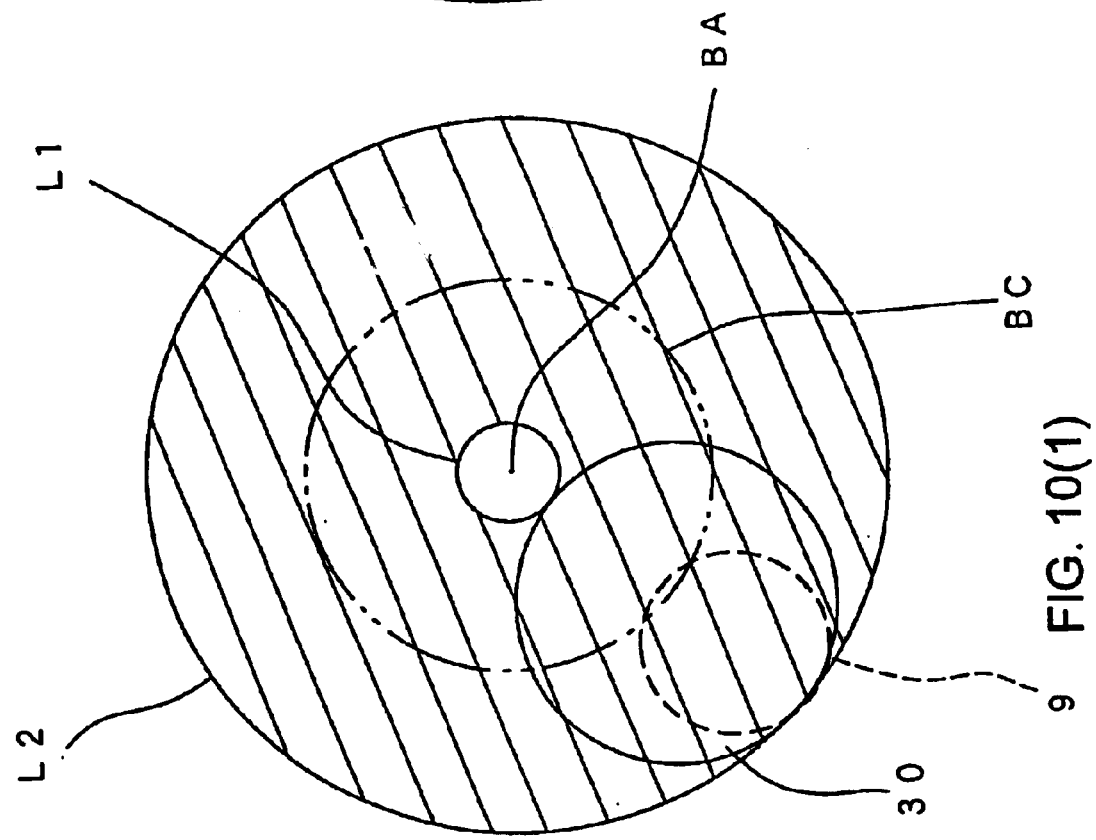

MULTILAYER FILM DEPOSITION APPARATUS, AND METHOD AND APPARATUS FOR MANUFACTURING PERPENDICULAR-MAGNETIC-RECORDING MEDIA

BACKGROUND OF THE INVENTION

This invention relates to a multilayer film deposition apparatus. Especially, this invention relates to an apparatus preferably used for manufacturing perpendicular-magnetic recording media.

Thin-film deposition on a substrate is widely practical for manufacturing various kinds of products, e.g. electronics devices such as LSI, display devices such as LCD, and recording media such as magnetic recording disks. In such film deposition, sputtering is often employed because a high-quality film can be deposited at a high rate. A desired multilayer film is sometimes deposited by the sputtering on purpose to satisfy function of a product. For example, in the magnetic-recording-disk manufacture, after depositing an underlying film on a substrate, a magnetic film as the magnetic recording layer is deposited thereon. Not a monolayer but a multilayer of different magnetic materials is sometimes deposited as the recording layer.

Multilayer film deposition apparatuses depositing such multilayer films are divided into two types in respect to the number of the deposition chamber. In one type of apparatuses, a multilayer film is deposited in one deposition chamber. In this type, multiple targets are provided in the deposition chamber. A substrate is transferred to each position facing to each target in order. In the other type of apparatuses, deposition chambers as many as the layers to be laminated are provided so that each layer can be deposited in each deposition chamber respectively. A substrate is transferred to each deposition chamber in order, in which each layer is deposited.

The sputtering is very practical for depositing such multilayer films. In the sputtering, a substrate is placed facing to a target that composes a cathode. Appling DC or high-frequency (HF) voltage to the cathode, sputtering discharge is ignited. During the sputtering discharge, particles of the same material as the target are released therefrom. Those particles, which are hereinafter called "sputter-particles", reach the substrate, thereby depositing a layer. In depositing a multilayer film, the sputtering is repeated using multiple targets. Those targets are often made of different materials for depositing a dissimilar-multilayer film.

In the dissimilar-multilayer film deposition by the sputtering, cross contamination of the targets must be prevented so that property deterioration of each layer can be avoided. While one of layers is deposited by sputter-particles from a target prepared for itself, other sputtered particles from another target for another layer might reach the substrate, resulting in that the layer being deposited is contaminated.

Interlayer contamination must be prevented as well. If a substrate is exposed to contaminating atmosphere after depositing a layer before depositing the next layer, such interlayer contamination as surface oxidation may take place. Especially, in manufacturing magnetic recording media such as perpendicular-magnetic-recording disks, magnetic layers as many as about twenty are sometimes laminated. Because the layers are very thin, interlayer contamination may easily affect them if it takes place. When such layers for a perpendicular-magnetic recording disk are deposited in different chambers, interlayer contamination tends to take place easily. This is because the substrate may be exposed to contaminating atmosphere while it is transferred from one chamber to another chamber.

Productivity upgrading and occupation-space downsizing are still greatly required to multilayer film deposition apparatuses. High productivity and small occupation space are required even to apparatuses depositing such a large number of layers. To secure property of multilayer films, control of deposition conditions is also important. Pressure, gas flow rate and other parameters must be controlled at required values.

SUMMARY OF THE INVENTION

Object of this invention is to present a practical multilayer film deposition apparatus that can satisfy the described requirement. According to this object, this invention presents a multilayer film deposition apparatus comprising; a substrate holder to hold at least one substrate, a vacuum chamber in which a multilayer film is deposited by sputtering onto the substrate held by the substrate holder, plural cathodes that comprise targets respectively and are provided in the vacuum chamber, at least one sputter power source for applying voltage to the cathodes to ignite sputter discharge, and a main rotation mechanism for rotating each cathode together. The targets are arranged at positions where the center axes of the targets are located on a circumference. The main rotation mechanism rotates the cathodes around the axis in common to the circumference. The substrate holder holds the substrate at a position within an area in view to the direction of the axis. The area is formed of two loci of points on the rotated targets. One of the loci is drawn by the point nearest to the axis, and the other locus is drawn by the point furthest from the axis.

BRIEF DESCRIPTION OF DRAWINGS

FIG. 1 is a schematic side cross sectional view of the apparatus of the first embodiment of the invention.

FIG. 2 is a schematic front view of a substrate holder 90 in the apparatus shown in FIG. 1.

FIG. 7 is a schematic front view to show, locations of each target 30 and each substrate 9 during the deposition in the apparatus shown in FIGS. 1–6.

FIGS. 9(1)–9(5) show steps of the multilayer film deposition in the apparatus shown in FIGS. 1–8.

FIGS. 10(1) and 10(2) are schematic front views to explain dependency of deposition uniformity on substrate location.

DETAILED DESCRIPTION OF THE PREFERRED EMBODIMENTS

Figure 3:
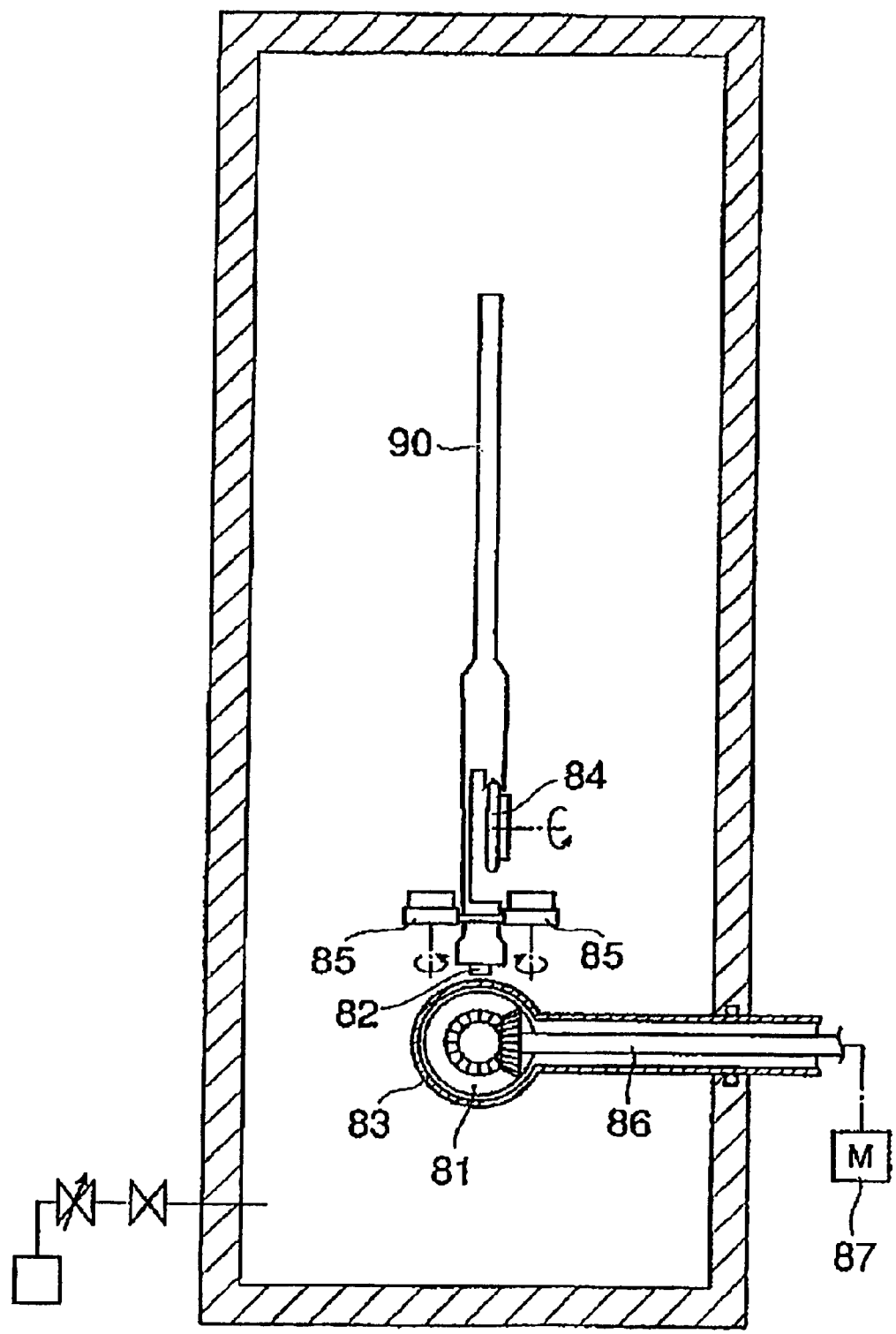
FIG. 3 is a schematic side cross sectional view of the substrate holder 90 in the apparatus shown in FIG. 1.

The preferred embodiments of the invention will be described in detail as follows. The apparatus described as follows is supposed to be used in manufacturing magnetic recording media such as hard-disks. FIG. 1 is a schematic side cross sectional view of the apparatus of the first embodiment of the invention. The apparatus shown in FIG. 1 comprises a deposition chamber 1 having a pumping line 11, a substrate holder 90 to locate at least one substrate 9 at a required position in the deposition chamber 1, and plural cathodes for sputtering discharge. The cathodes are the components of a cathode unit 3.

The deposition chamber 1 is the air-tight vacuum chamber comprising an opening (not shown) for transfer-in-and-out of the substrate 9. The opening is shut and opened by a gate valve (not shown). The deposition chamber 1 comprises a gas introduction line 12 to introduce a gas for the sputtering discharge into the inside. The gas introduction line 12 introduces a gas of high sputter-rate, e.g. argon.

The substrate holder 90 holds the substrate 9, making it upright. The substrate holder 90 is capable of holding a couple of the substrates 9 simultaneously. A couple of the substrates 9 are held on the same vertical plane, and at the same height (i.e. the line interconnecting the centers of both substrates 9 is horizontal).

FIG. 2 and FIG. 3 show schematic views of the substrate holder 90 in the apparatus shown in FIG. 1. FIG. 2 is a front view, and FIG. 3 is a side view. The substrate holder 90 comprises a main body 92 and six holding claws 91. Each three of the claws 91 holds each substrate 9 respectively. As shown in FIG. 2, the substrate holder 90 in this embodiment comprises many small magnets 96 at the bottom. These magnets 96 are hereinafter called "holder magnets". Each holder magnet 96 has a magnetic pole on the top and the bottom. As shown in FIG. 2, magnetic poles of the holder magnets 96 are alternatively opposite in the array direction.

Beneath the substrate holder 90, a magnetic-coupling roller 81 is provided, interposing a partition wall 83. The magnetic-coupling roller 81 is a cylinder, on which two spirally elongated magnets 82 are provided as shown in FIG. 2. These magnets 82 are hereinafter called "roller magnets". Surface pole of each roller magnet 82 is opposite to each other. In short, the magnetic-coupling roller 81 has a so-called double-helix structure. The magnetic-coupling roller 81 is provided at a position where the roller magnets 82 face to the holder magnet 96 through the partition wall 83. The partition wall 83 is formed of material that would not disturb the magnetic field, e.g. non-magnetic material. The holder magnets 96 and the roller magnets 82 are magnetically coupled with each other. One side to the partition wall 83 where the first substrate holder 90 is provided is the space kept at a vacuum pressure. The other side to the partition wall 83 where the magnetic-coupling roller 81 is provided is the space of the atmospheric pressure. The magnetic-coupling roller 81 is provided along the transfer line of the substrates 9.

Multiple main pulleys 84 that are rotated around horizontal axes are provided along the transfer line. As shown in FIG. 3, the substrate holder 90 rides on the main pulleys 84. A couple of sub-pulleys 85, 85 are in contact with the lower margin of the substrate holder 90. The sub-pulleys 85, 85 pinch the lower margin of the substrate holder 90 to prevent the substrate holder 90 from falling. The multiple sub-pulleys 85, 85 are provided along the transfer line as well.

As shown in FIG. 3, a drive rod 86 is connected with the magnetic-coupling roller 81 through a bevel gear. A motor 87 is connected with the drive rod 86 so that the magnetic-coupling roller 81 can be rotated around its center axis by driving force transferred from the motor 87 through the drive rode 86. When the magnetic-coupling roller 81 is rotated, the double-helix roller magnets 82 shown in FIG. 2 are also rotated. Situation that the roller magnets 82 are rotated is equivalent to situation that plural aligned small magnets of which poles are alternately opposite move simultaneously along the aligning direction. Therefore, the holder magnets 96 magnetically coupled with the roller magnets 82 also move linearly as the roller magnets 82 are rotated, resulting in that the substrate holder 90 moves linearly together. During this liner movement, the main pulleys 84 and the sub-pulleys 85, 85 shown in FIG. 3 are driven to rotate, following the movement.

Figure 4:
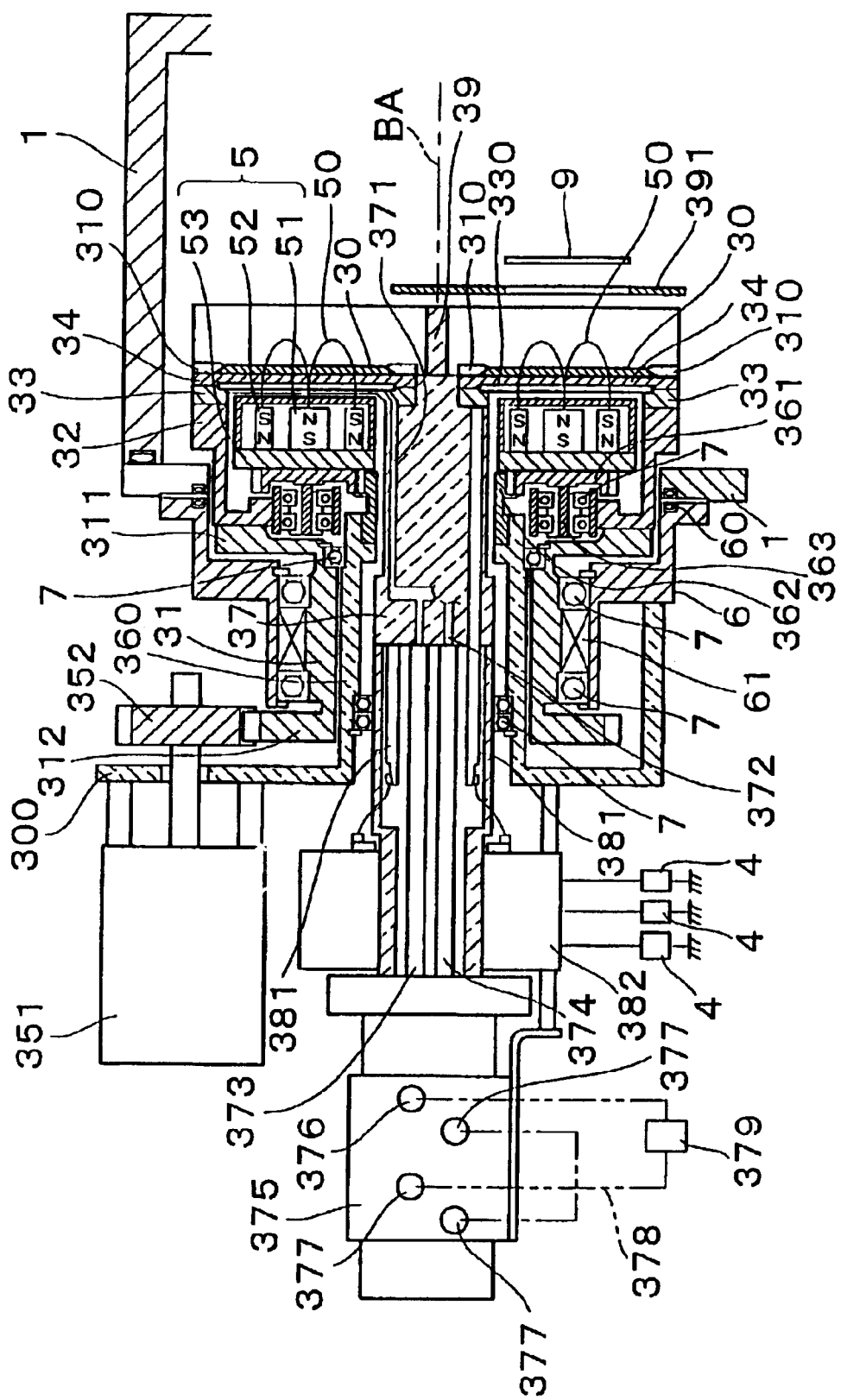
FIG. 4 is a detailed side cross sectional view of the cathode unit 3 shown in FIG. 1.

In this embodiment, the cathode unit 3 is provided at both sides of the substrates 9 held by the substrate holder 90. The cathode unit 3 comprises the cathodes having targets 30 and magnet assemblies 5 respectively. Using FIG. 4, the detailed structure of the cathode unit 3 will be described as follows. FIG. 4 is a detailed side cross sectional view of the cathode unit 3 shown in FIG. 1. The both cathode units 3 shown in FIG. 3 have the same structure, i.e. being symmetric to the substrates 9. In FIG. 4, the left side one of them is shown. Considering convenience for drawing, the cross section shown in FIG. 4 is not a complete vertical plane but the X—X plane shown in FIG. 5 and to the direction designated by the arrows shown in FIG. 5.

An opening a little wider than the cross section of the cathode unit 3 is provided on the side wall of the deposition chamber 1. The cathode unit 3 is inserted to this opening. A unit mount 6 is fixed on the outer surface of the side wall of the deposition chamber 1. The unit mount 6 is cylindrical and has a step in the cross-sectional configuration as shown in FIG. 4. The end of the unit mount 6 is fixed on the outer surface of the chamber 1, inserting a vacuum seal 60 such as an O-ring. A main holder 31 is provided inside the unit mount 6. The main holder 31 is also cylindrical and coaxial to the unit mount 6. The axis of the main holder 31 is hereinafter called "basis axis" and designated by "BA" in FIG. 4.

A right holder-flange 311 is provided at the right end of the main holder 31. A cathode mount 32 is fixed on the right holder-flange 311. The cathode mount 32 is cylindrical and coaxial to the basis axis BA, having the cross-sectional shape shown in FIG. 4. The right end of the cathode mount 32 is located inside the chamber 1, on which three cavity boards 33 are fixed. A backing plate 34 is fixed on each cavity board 33. Each target 30 is mounted on each backing plate 34 by a target clamp 310 for easy demount. One cavity board 33, one backing plate 34 and one target 30 are laid over in this order, composing one cathode. Each cathode is fixed on the right end of the cathode mount 32. Not clearly shown in FIG. 4, three circular openings are formed on the right end of the cathode mount 32, corresponding to the positions of the targets 30. Each cathode is fixed in each opening respectively. The cavity boards 33 and the backing plates 34 are disk-shaped and a little larger than the targets 30. Cathode means a member to which voltage for sputtering is applied.

Figure 5:
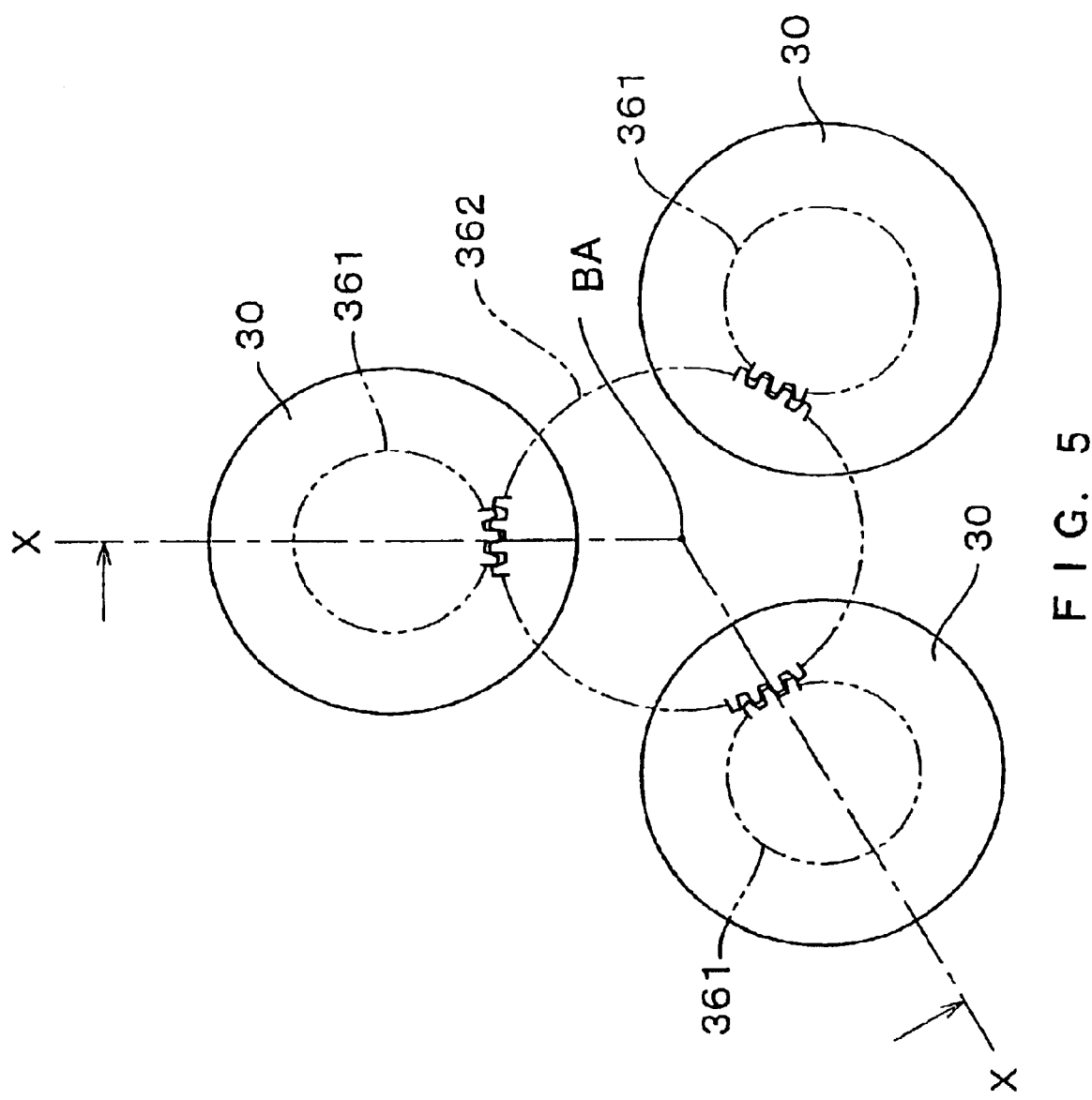
FIG. 5 is a schematic front view to show configuration and layout of the targets 30.

FIG. 5 is a schematic front view to show configuration and layout of the targets 30. As shown in FIG. 5, three targets 30 are comprised of one cathode unit 3. Each target 30 is all disk-shaped and the same in size. Each target 30 is equally distant from each other on a circumference coaxial to the basis axis BA. Each cavity board 33 is configured as to form a cavity 330 together with each backing plate 34. Coolant is introduced to each cavity 330.

The first point characterizing this embodiment is that the apparatus comprises a main rotation mechanism that rotates the targets 30 around the axis in common with the circumference on which the center axes of the targets 30 are located, i.e. around the basis axis BA. The main rotation mechanism is basically composed of the described main holder 31, a rotary actuator 351 such as motor to rotate the main holder 31, and other components.

Concretely, a left holder-flange 312 is provided at the left end of the main holder 31. The round edge of the left holder-flange 312 is a gear (hereinafter called "flange gear"). A driving gear 352 engaging the flange gear is connected with the output shaft of the rotary actuator 351. When the rotary actuator 351 is operated, the main holder 31 is rotated around the basis axis BA through the driving gear 352. As a result, each target 30 is also rotated around the basis axis BA that is eccentric from each target 30. The main holder 31 is supported by the unit mount 6. A bearing 7 is provided between the unit mount 6 and the main holder 31, allowing the rotation of the main holder 31.

A magnet assembly 5 is provided in the cathode mount 32. The magnet assembly 5 is provided at the back of each target 30. The magnet assembly 5 is basically composed of a center magnet 51, a peripheral magnet 52 surrounding the center magnet 51, and a yoke 53 interconnecting the center magnet 51 and the peripheral magnet 52. Magnetic flux 50, as shown in FIG. 4, penetrates the target 30, forming an arch at the fore discharge space. Electrons at the discharge space are confined in the closed region formed of the target 30 and the arch-shaped magnetic flux 50, resulting in that the highly-efficient magnetron sputtering is established.

The yoke 53, which is provided uprightly, is disk-shaped and a little smaller than the target 30. The center magnet 51 is, for example, short-column-shaped. The peripheral magnet 52 is, for example, elliptical-ring-shaped. Though the target 30 and the yoke 53 are coaxial to each other, shapes and arrangements of the center magnet 51 and the peripheral magnet 52 are asymmetrical to the center axis of the target 30. In other words, the magnetic field applied by the magnet assembly 5 is asymmetrical to the center axis of the target 30. This is to make the time-average magnetic field intensity more uniform on the target 30 when the magnet assembly 5 is rotated.

The second point characterizing this embodiment is an auxiliary rotation mechanism that rotates each magnet assembly 5 around the axis in common with the center axis of each target 30. The auxiliary rotation mechanism rotates each magnet assembly 5 by the driving force for the main rotation mechanism. Concretely, the auxiliary rotation mechanism is basically composed of a driven gear 361 provided on each magnet assembly 5, and a stationary gear 362 to transform the torque from the main rotation mechanism into the torque for rotating each magnet assembly 5.

Each driven gear 361 is fixed on the bottom of the yoke 53. Each driven gear 361 is coaxial to each target 30. A shaft 363 is fixed on the center of each driven gear 361, being lengthened perpendicularly to each driven gear 361. Each shaft 363 is mounted with the cathode mount 32, inserting a bearing 7. The rotary actuator 351 of the main rotation mechanism is mounted on a base board 300. The base board 300 is provided uprightly. An opening through which a spindle 37 is inserted is provided with the base board 300. A gear holder 360 is provided at the edge of the opening, being lengthened perpendicularly to the base board 300. The gear holder 360 is roughly a cylinder of which the center axis is in common with the basis axis BA.

The stationary gear 362 is fixed at the top of the gear holder 360. The stationary gear 362, of which teeth are outward, is located at the position where its axis is in common with the basis axis BA. As shown in FIG. 5, the stationary gear 362 engages each driven gear 361. Layout and engagement of the stationary gear 362 and the driven gear 361 are shown in FIG. 5.

As understood from FIG. 4 and FIG. 5, because each magnet assembly 5 is connected with the cathode mount 32 by the shaft 363, when each target 30 is rotated around the basis axis BA as the main holder 31 is rotated by the rotary actuator 351, each magnet assembly 5 and each driven gear 361 are rotated around the basis axis BA as well. Such the eccentric rotation as this is hereinafter called "revolution". "Revolution" means rotation of a member around an axis eccentric from itself. Because each driven gear 361 engages each stationary gear 362 at the side closer to the basis axis BA, each driven gear 361 is rotated around the center axis in common to each target 30 during the revolution. Such the concentric rotation as this is hereinafter called "spin". "Spin" means rotation of a member around the axis concentric with itself. As each driven gear 361 is spun, each magnet assembly 5 is spun together. After all, the magnet assembly 5 performs the revolution around the basis axis BA and the spin around its center axis simultaneously. A bearing 7 is provided between the gear holder 360 and the unit mount 6.

The spindle 37 is provided penetrating the main holder 31 at the center. The spindle 37 holds the cavity board 33, the backing plate 34 and other members at the top. The spindle 37 is column-shaped at the right half, and cylindrical, i.e. hollow, at the left half. The cylindrical left half is the same in diameter as the right half. A coolant introduction channel 371 is perforated through the right column-shaped portion (hereinafter "column portion"). The coolant is introduced through the coolant introduction channel 371 into the cavity 330. The coolant introduction channel 371 is ramified into three branches. Each branch reaches each cavity 330 behind each target 30 respectively. A coolant drainage channel 372 is perforated through the column portion. Not clearly shown in FIG. 4, the coolant drainage channel 372 is provided with each cavity 330.

In the left cylindrical half of the spindle 37 (hereinafter "cylindrical portion"), a coolant introduction pipe 373 and coolant drainage pipes 374 are provided. The coolant introduction pipe 373 is connected with the coolant introduction channel 371. The coolant drainage pipes 374 are connected with the coolant drainage holes 372 respectively, though only one appears in FIG. 4. Power-supply rods 381 are provided penetrating the column portion and the cylindrical portion of the spindle 37. The power-supply rods 381 are to supply power for the sputtering discharge to the targets 30. Three power-supply rods 381 are provided, though only one appears in FIG. 4. As shown in FIG. 4, the top of the power-supply rod 381 is in contact with the cavity board 33. The cavity board 33 and the backing plate 34 are made of metal such as stainless-steel or copper so that the power can be supplied through them to the target 30. Insulators (not shown) are provided between the power-supply rods 381 and the spindle 37, between each cathode and the spindle 37, and at other required places. Therefore, the power supplied through the power-supply rods 381 does not leak to the spindle 37. In addition, insulators are provided between the cathodes so that each cathode can be insulated from each other.

Figure 6:
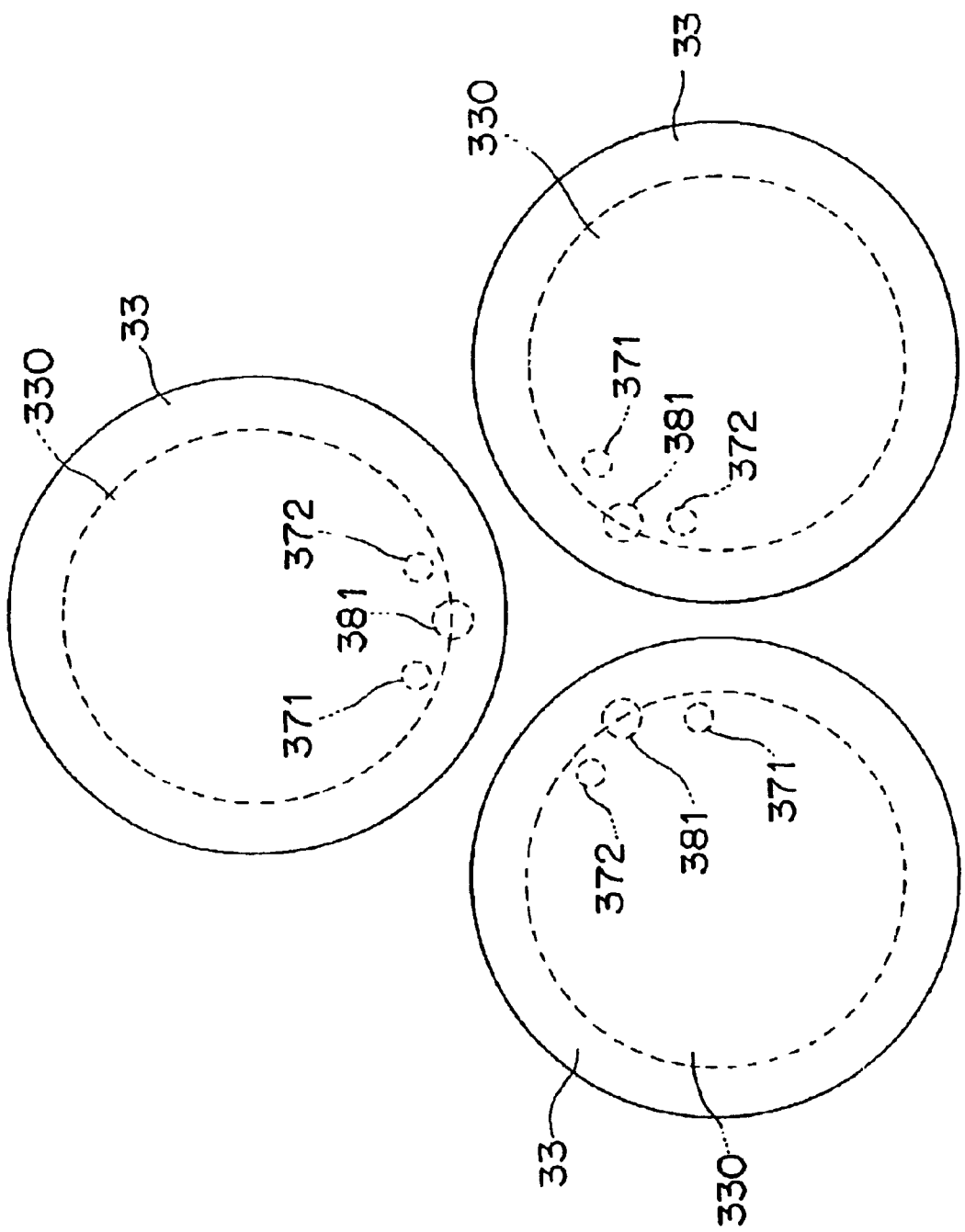
FIG. 6 is a schematic front view to show the inlet and outlet positions of coolant, and the power-supplying position.

FIG. 6 is a schematic front view to show the inlet and outlet positions of the coolant, and the power-supplying position. As shown in FIG. 6, the each power-supply rod 381 is in contact with the each cavity board 33 at the positions nearest to the basis axis BA. The coolant introduction channel 371 and the coolant drainage channel 372 are communicated with the cavity 330 at positions close to the contact position of the power-supply rod 381. The contact position of the power-supply rod 381 is located between the inlet position from the coolant introduction channel 371 and the outlet position to the coolant drainage channel 372.

In the described revolution and spin, the spindle 37 is also spun around the basis axis BA. A slip ring 382 and a rotary joint 375 are provided so that the supply of the power and the circulation of the coolant are enabled in spite that the spindle 37 is spun. As shown in FIG. 4, the slip ring 382 is provided surrounding the left end of the spindle 37. The power-supply rods 381 are connected with the slip ring 382 by cables. The slip ring 382 is connected three sputter power sources 4, which are provided for three targets 30 respectively.

The slip ring 382 is to secure electrical continuity by contacting a spring band on a rotating cylinder. As the slip ring 382, for example "φ150-60 3ch SR" of Globe Tech Inc., Tachikawa, Tokyo, Japan can be employed. The rotary joint 375 is connected at the left end of the spindle 37. The rotary joint 375 comprises a coolant introduction hole 376 communicating to the coolant introduction pipe 373, and three coolant drainage holes 377 communicating to three coolant drainage pipes 374 respectively. In spite of the rotation of the spindle 37, the rotary joint 375 secures communication of the coolant introduction pipe 373 and the coolant introduction hole 376, and communication of each coolant drainage pipe 374 and each coolant drainage hole 377. As the rotary joint 375, for example "KT-4-02-1W" of KOYO YUATSU Co., Ltd., Setagaya, Tokyo, Japan can be employed.

As shown in FIG. 4, the coolant introduction hole 376 communicates to each coolant drainage hole 377 through a pipe 378 and a circulator 379. The coolant cooled at a required low temperature at the circulator 379 is introduced to each cavity 330 through the coolant introduction hole 376, the coolant introduction pipe 373 and each coolant introduction channel 371. The coolant is drained from each cavity 330 back to the circulator 379 through each coolant drainage channel 372, each coolant drainage pipe 374 and each coolant drainage hole 377.

Three power-supply rods 381, the slip ring 382, three sputter power sources 4 and other components compose a power-supply line to supply the power for the sputtering discharge to the targets 30. Each sputter power source 4 is capable of independent control of its output level so that the power supplied to each target 30 can be controlled independently.

In the described structure of the cathode unit 3, vacuum seals such as O-rings are provided at required places so that leakage of vacuum maintained in the deposition chamber 1 can be prevented. Especially, a magnetic-fluid seal 61 is adopted at the place between the unit mount 6 and the main holder 31. The magnetic-fluid seal 61, which utilizes magnetic fluid as sealant, prevents leakage of vacuum at the clearance of the unit mount 6 and the main holder 31, allowing the rotation of the main holder 31.

The apparatus of this embodiment is a kind of inline type apparatuses where plural chambers including the described deposition chamber 1 are aligned along the transfer line of the substrate 9. Disclosure in the Japanese laid-open No.H8-274142 can be referred to for details and layout of the chambers. As the mechanism to move the substrate holder 90 holding the substrates 9, one disclosed in the above Japanese laid-open No.H8-274142 can be employed.

Following is the description about the relationship of each target 30 and each substrate 9 during the deposition. FIG. 7 is a schematic front view to show locations of each target 30 and each substrate 9 during the deposition in the apparatus shown in FIGS. 1–6. As described, each target 30 is located at the position 120 degree apart from each other on the circumference of which center is in common with the basis axis BA. This circumference is hereinafter called "basis circumference" and designated by "BC" in FIG. 7.

The substrate holder 90 holds a couple of the substrates 9 at the same height, i.e. in state that the line interconnecting the centers of the substrates 9 would be horizontal, as described. More concretely, the substrate holder 90 holds a couple of the substrates 9 in state that the center of each substrate 9 is located on the basis circumference BC at the front view as shown in FIG. 7. Expressing more exactly, the substrate holder 90 holds the substrates 9 in state that the center axis of each substrate 9 is crossed perpendicularly with the basis circumference BC. The transfer mechanism (not shown) stops the substrate holder 90 at the position satisfying the relation shown in FIG. 7, at which the deposition is carried out.

Figure 8:
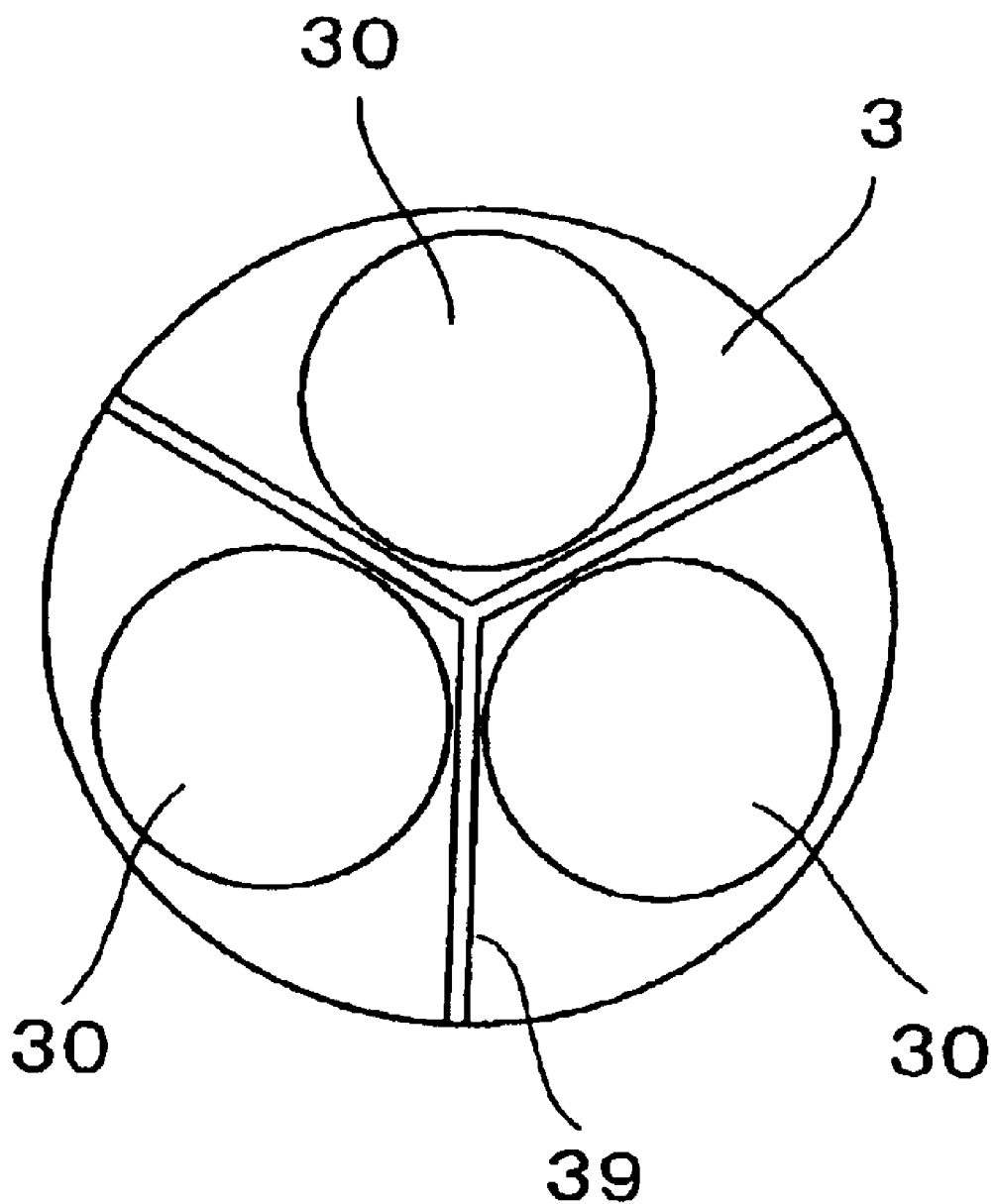
FIG. 8 is a schematic front view of the partition member 39 shown in FIG. 4.

As shown in FIG. 4, the apparatus of this embodiment comprises a partition member 39. The partition member 39 is to block off sputter-particles from a target 30 so as not to mingle with other sputtered particles from other targets 30. Detail of the partition member 39 will be described as follows, using FIG. 4 and FIG. 8. FIG. 8 is a schematic front view of the partition member 39 shown in FIG. 4. As shown in FIG. 4, the partition member 39 is fixed with the spindle 37 and the cavity board 33. As understood from FIG. 4 and FIG. 8, the partition board 39 is combined with band plates, and provided so that it can partition the space in front of the targets 30. Because three targets 30 are provided in this embodiment, the partition member 39 is trifurcate in the front view.

If the partition member 39 is not provided, cross contamination of the targets 30 may arise. Concretely, sputter-particles released from a target 30 may reach and adhere to another target 30. The adherent sputter-particles are released by re-sputtering. However, in case each target 30 is made of material different from each other, it means that particles of not inherent material of the target 30 itself are released. If this takes place, a layer would involve improper material, degrading property of the multilayer film.

Contrarily in this embodiment, the partition member 39 blocks off sputter-particles released from a target 30 so as not to reach another target 30. Accordingly, the described cross contamination is prevented. Additionally, while the sputtering is carried out on a substrate 9 by a target 30, particles released from another target 30 can be prevented from reaching directly to the substrate 9 by the partition member 39.

As shown in FIG. 4, a shield 391 is provided between the targets 30 and the positions at which the substrates 9 are located. The shield 391 is board-shaped and in parallel to the targets 30. The shield 391 has circular openings of essentially the same size as the substrates 9. When the substrates 9 are stopped at the described positions, the openings of the shield 391 are coaxial to the substrates 9. The number of the openings is two, corresponding to the substrates 9. It is not always necessary that the openings are coaxial to the substrates 9. What is required is only that the shield 391 is so located and in an attitude that substrates 9 can face to the targets 30 through the openings. Main function of the shield 391 is to enable each substrate 9 to receive sputter-particles only from the target 30 facing to itself. Together with the partition member 39, the shield 391 enhances quality of the multilayer film deposition.

Following is the description about operation of the multilayer film deposition apparatus of this embodiment. A couple of the substrates 9 are loaded on the substrate holder 90 in a load-lock chamber (not shown). The substrate holder 90 is moved to a pre-heat chamber (not shown), in which pre-heat of the substrates 9 is carried out. After the pre-heat, the substrate holder 90 is moved to the deposition chamber 1 shown in FIG. 1 and FIG. 4. The substrate holder 90 is stopped at the described position where the center of each substrate 9 is on the basis circumference BC in the front view.

Then, the rotary actuator 351 is operated to start the revolutions of the targets 30 and the magnet assemblies 5 around the basis axis BA, and the spin of each magnet assembly 5 around each center axis. The revolution speed is in the range of 10 rpm to 300 rpm, and the spin speed is in the range of 16 rpm to 500 rpm. The deposition chamber 1 is pumped at a required vacuum pressure through the pumping line 11 in advance. After the gate valve (not shown) is closed, a required gas is introduced through the gas-introduction line 12 at a required flow-rate. In this state, each sputter power source 4 is operated according to the sequence described later, thereby applying a required voltage to each target 30 via each power-supply rod 381 respectively. The voltage is negative high DC voltage or high-frequency (HF) voltage. The applied voltage provides an electric field between the substrate 9 and the target 30, igniting sputtering discharge. During the sputtering discharge, sputter-particles, usually in state of atoms, are released from the target 30. The sputter-particles reach and accumulate on the substrate 9, thereby depositing a layer.

In the above deposition, by optimizing the rotation of the cathode unit 3 and operation timing of each sputter power source 4, a desired multilayer film is deposited on each substrate 9. This point will be described using FIG. 9. FIG. 9 shows steps of the multilayer film deposition by the apparatus shown in FIGS. 1–8. For convenience of the description, three targets 30 are hereinafter discriminated as 30A, 30B and 30C as shown in FIGS. 9(1)–9(5). For the same reason, supposedly a layer La is deposited by the target 30A, a layer Lb is deposited by the target Lb, and the layer Lc is deposited by the target 30C. For the substrates 9 as well, the left side one is hereinafter "substrate 9X", and the right side one is hereinafter "substrate 9Y", as shown in FIGS. 9(1)–9(5). Moreover, the sputter power source to apply the voltage to the target 30A is hereinafter "source 4A", the sputter power source to apply the voltage to the target 30B is hereinafter "source 4B", and the sputter power source to apply the voltage to the target 30C is hereinafter "source 4C". Initially, as shown in FIG. 9(1), the substrate holder 90 is stopped at the position where the substrate 9X faces to the target 30A, and the substrate 9Y faces to the target 30B. The substrate 9X is off-axis from the target 30A, shifting to the clockwise direction along the basis circumference BC.

In the state shown in FIG. 9(1), the Source 4A is operated to carry out the deposition on the substrate 9X by the target 30A, i.e. the deposition of the layer La. During this deposition, the main rotation mechanism is operated to rotate the targets 30A, 30B, 30C together clockwise around the basis axis BC. After the target 30A passes through in front of the substrate 9X, when the rotation of the cathode unit 3 reaches 120 degree, the clockwise-side edge of the target 30B is located at the position in the vicinity of the center of the substrate 9X in the front view as shown in FIG. 9(2). At this moment, operation of the source 4B is started, resulting in that the deposition onto the substrate 9X by the target 30B, i.e. the deposition of the layer Lb, is carried out.

The deposition onto the substrate 9X by the target 30B continues until the target 30B passes through in front of the substrate 9X. When the clockwise rotation of the cathode unit 3 reaches 120 degree again, the clockwise-side edge of the target 30C is located the position in the vicinity of the center of the substrate 9X as shown in FIG. 9(3). At this moment, operation of the source 4C is started, resulting in that the deposition onto the substrate 9X by the target 30C, i.e. the deposition of the layer Lc, is carried out.

On the other hand, before the state shown in FIG. 9(3), the clockwise-side edge of the substrate 9Y is located at the position in the vicinity of the center axis of the substrate 9Y. Because operation of the source 4a was already started, the deposition onto the substrate 9Y by the target 30A, i.e. the deposition of the layer La, is carried out. Until this moment from the state shown in FIG. 9(2), though operation of the source 4A may be continued, it is preferable to suspend and resume it for saving consumption of target 30A and consumption of electric energy. The deposition onto the substrate 9Y by the target 30A continues until the state of FIG. 9(3).

When the cathode unit 3 is rotated clockwise at another 120 degree, the state progresses as shown in FIG. 9(4). Before the state shown in FIG. 9(4), the clockwise-side edge of the target 30B is located at the position in the vicinity of the center of the substrate 9Y, At this moment, the deposition onto the substrate 9Y by the target 30B, i.e. the deposition of the layer Lb, is started, continuing until the state shown in FIG. 9(4). Operation of the source 4B is, as well, preferably suspended until the clockwise-side edge of the target 30B reaches in the vicinity of the center axis of the substrate 9Y.

When the cathode unit 3 is rotated clockwise at another 120 degree from the state shown in FIG. 9(4), it progresses as shown in FIG. 9(5). Before FIG. 9(5), the clockwise-side edge of the target 30C reaches the position in the vicinity of the center axis of the substrate 9Y. At this moment, the deposition onto the substrate 9Y by the target 30C, i.e. the deposition of the layer Lc, is started, continuing until the state shown in FIG. 9(5). Operation of the source 4C is, as well, preferably suspended until the clockwise-side edge of the target 30C reaches the position in the vicinity of the center axis of the substrate 9Y. After the state shown in FIG. 9(3), the target 30A and the target 30B pass through in front of the substrate 9X again. In this period, operations of the source 4A and the source 4B are suspended so that further depositions of the layers La, Lb onto the substrate 9X can be avoided.

In the period from the state of FIG. 9(1) to the state of FIG. 9(5), the layer La, the layer Lb and the layer Lc are laminated in this order onto each substrate 9X, 9Y. With the end of this period, operation of one tact-time in the deposition chamber 1 is completed. Afterward, the deposition chamber 1 is pumped again through the pumping line 11. Then, the substrate holder 90 is moved to an unload-lock chamber (not shown), in which the processed substrates 9X, 9Y are unloaded from the substrate holder 90.

In the next tact-time, another substrate holder 90 that holds other unprocessed substrates 9X, 9Y is moved into the deposition chamber 1, in which the same steps are repeated. By the moment the next tact-time is started, the cathode unit 3 is rotated at 240 degree (or −120 degree) from the state shown in FIG. 9(4), resuming the state shown in FIG. 9(1).

As described, the apparatus of this embodiment deposits a multilayer film by making the targets 30 face to the substrates 9 by turns as the cathode unit 3 is rotated. After deposition of a layer, the next layer is deposited in the same deposition chamber 1 without transfer motion of the substrates 9. Accordingly, the apparatus has the merit of high productivity, the advantage in the apparatus occupation space, and no problem of the interlayer contamination. In addition, because the partition member 39 and the shield 391 prevent the targets 30 from the cross contamination, property of the multilayer film is not deteriorated but ameliorated.

Moreover, because the center axis of each substrate 9 is on the locus drawn by the centers of the targets 30, i.e. on the basis circumference BC, the deposited multilayer film is uniform and homogeneous in film thickness and film property. The uniform and homogeneous film deposition is sometimes enabled even if the center axis of each substrate 9 is not on the basis circumference BC, depending on the sizes of the targets 30 and the substrates 9. For the uniform and homogeneous film deposition, what is required is only that the outline of each substrate 9 is located within an area in view to the direction along the axis. This point is described in detail using FIGS. 10(1) and 10(2). FIGS. 10(1) and 10(2) are schematic front views to explain dependency of deposition uniformity on substrate location.

In FIGS. 10(1) and 10(2), L1 and L2 are the loci drawn by points on the rotated targets 30. The locus L1 is drawn by the points nearest to the basis axis BA. The locus L2 is drawn by the points furthest from the basis axis BA. As shown in FIG. 10(1), when the substrate 9 is, in view to the direction of the basis axis BA, located within the area formed of the loci L1 and L2, uniform deposition on the substrate 9 is enabled, because the substrate does not deviate from the targets 30. Contrarily, as shown in FIG. 10(2), when the substrate 9 is not within the area formed of the loci L1 and L2, uniform deposition on the substrate 9 is difficult. Therefore, the substrate holder 90 and the transfer mechanism are preferably designed so as to satisfy the relationship shown in FIG. 10(1).

When each target 30 is revolved, each magnet assembly 5 is revolved as it is spun. This is to establish the magnetron sputtering consistently. The point that the magnetic assemblies 5 are spun in addition to the revolution brings the merit to prolong the lifetimes of the targets 30. As known, the targets 30 are eroded as the sputtering is repeated, getting thinner and thinner. The erosion does not progress uniformly on the surfaces of the targets 30. It progresses rapidly at a region where the sputtering discharge is efficient, and slowly at a region where the sputtering discharge is not efficient. Efficiency of the sputtering discharge depends on profile of the magnetic field by the magnet assembly 5. Accordingly, if each magnet assembly 5 is not spun, the erosion progresses rapidly at a region where the magnetic field intensity is high, and slowly at a region where the magnetic field intensity is low. Therefore, even when the lifetimes of the targets 30 expire, not small amount may remain at a low-magnetic-field-intensity region. Even though, the targets 30 must be replaced, wasting the remaining amount of it. Contrarily, in case the magnet assemblies 5 are spun as in this embodiment, the magnetic field intensity is made uniform temporally. More concretely, the temporally-integrated magnetic field intensity is uniform within the surfaces of the targets 30. Therefore, The erosion progresses uniformly on the targets 30. Accordingly, the lifetimes of the targets 30 can be prolonged, reducing waste amount of the target materials.

As described, in the apparatus of this embodiment, the auxiliary rotation mechanism spins each magnet assembly 5 by utilizing the driving force of the main rotation mechanism. This point brings the merit that the apparatus can be simplified because it only needs one rotary actuator and one introduction line of the rotary motion. The point that the power-supply line is capable of the independent control of the power to supply to each target 30 brings merits in optimizing the multilayer film deposition. Each condition on the deposition of each layer can be optimized by controlling the power to supply to each target 30. For example, in case that the deposition rate of a layer tends to be low from its property or another factor, the power supplied to the target 30 for depositing the layer is controlled to be higher than other powers supplied to other targets 30. Such optimization is also possible by the magnetic assemblies 5. Using the magnetic assemblies 5 of electromagnets, the deposition condition for each layer can be optimized by controlling conducting current on each magnet assembly 5 independently.

Figure 11:
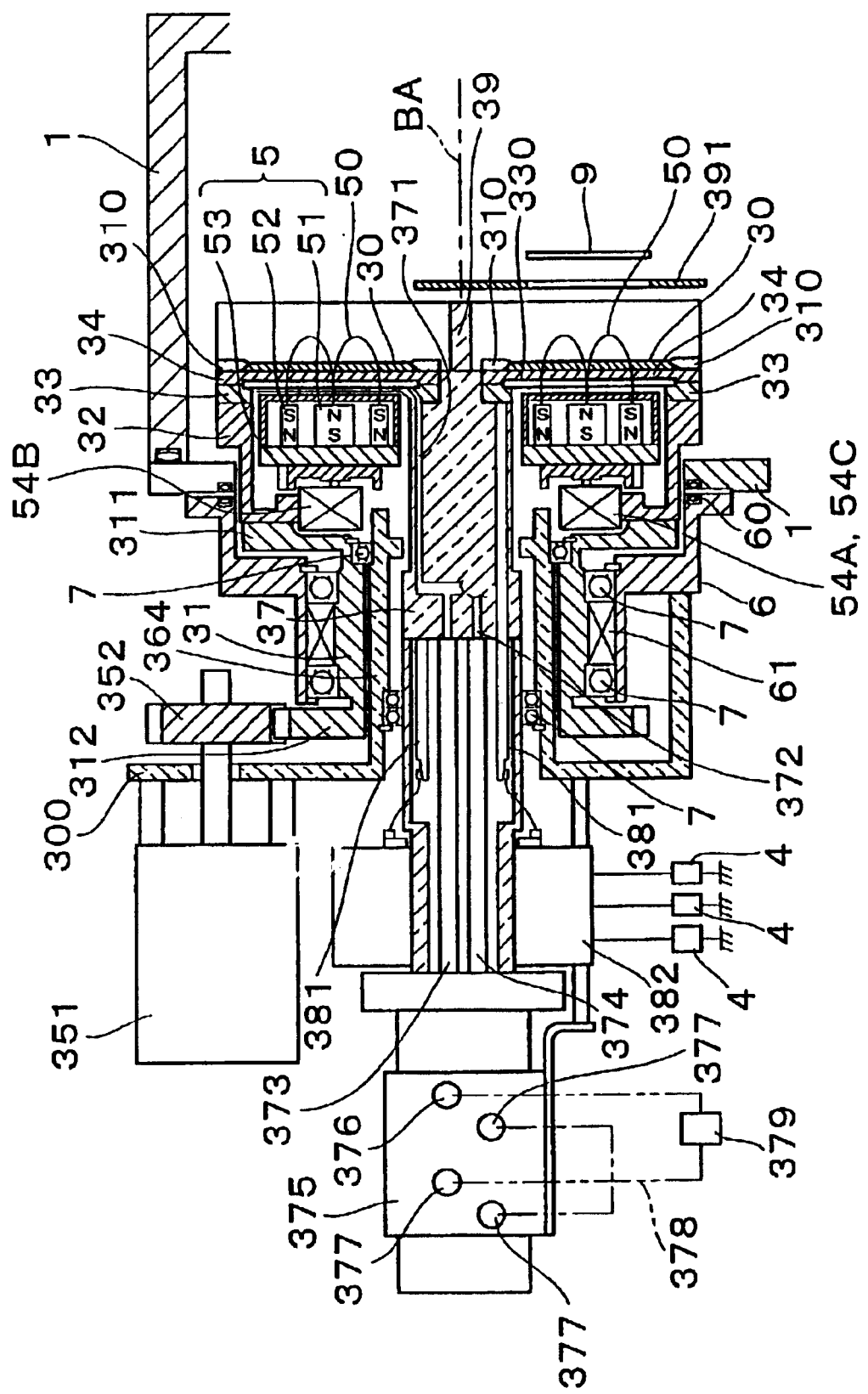
FIG. 11 shows a characterizing part in the multilayer deposition apparatus of the second embodiment of the invention.

Next, the apparatus of the second embodiment will be described. FIG. 11 shows a characterizing part in the multilayer deposition apparatus of the second embodiment. In the described first embodiment, each sputter power source 4 was operated as the cathode unit 3 was rotated, thereby depositing the multilayer film. In the second embodiment, contrarily, the cathode unit 3 is stationary during the depositions, although it is rotated at each interval between the depositions. The depositions are carried out as two of the stationary targets 30 face to two substrates 9 respectively.

Each component of the apparatus of the second embodiment is almost the same as of the first embodiment. However, there are several differences in the main rotation mechanism and the auxiliary rotation mechanism. One of the differences is that the auxiliary rotation mechanism rotates the magnet assemblies 5 independently from the main rotation mechanism. Concretely, a driving gear 352 engaging the flange gear is also connected with the output shaft of the rotary actuator 351 as shown in FIG. 11. When the rotary actuator 351 is operated, the main holder 31 is rotated around the basis axis BA through the driving gear 352, thereby revolving each target 30 together around the basis axis BA. On the other hand, the gear holder 360 and the stationary gear 362 in FIG. 4 are not provided. A stationary cylinder 364 having the same shape as the gear holder 360 is provided with the base board 300. The stationary cylinder 364 is disconnected from each magnet assembly 5. The auxiliary rotation mechanism that spins the magnet assemblies 5 comprises inside rotary actuators 54A, 54B, 54C connected with the magnet assemblies 5. Each inside rotary actuator 54A, 54B, 54C is substituted for the shaft 363 and the bearings around it shown in FIG. 4, and is to rotate each magnet assembly 5 around the same horizontal axis as the shaft 363. The inside rotary actuators 54A, 54B, 54C are installed on the main holder 31, being rotated together with the main holder 31.

Figure 12:
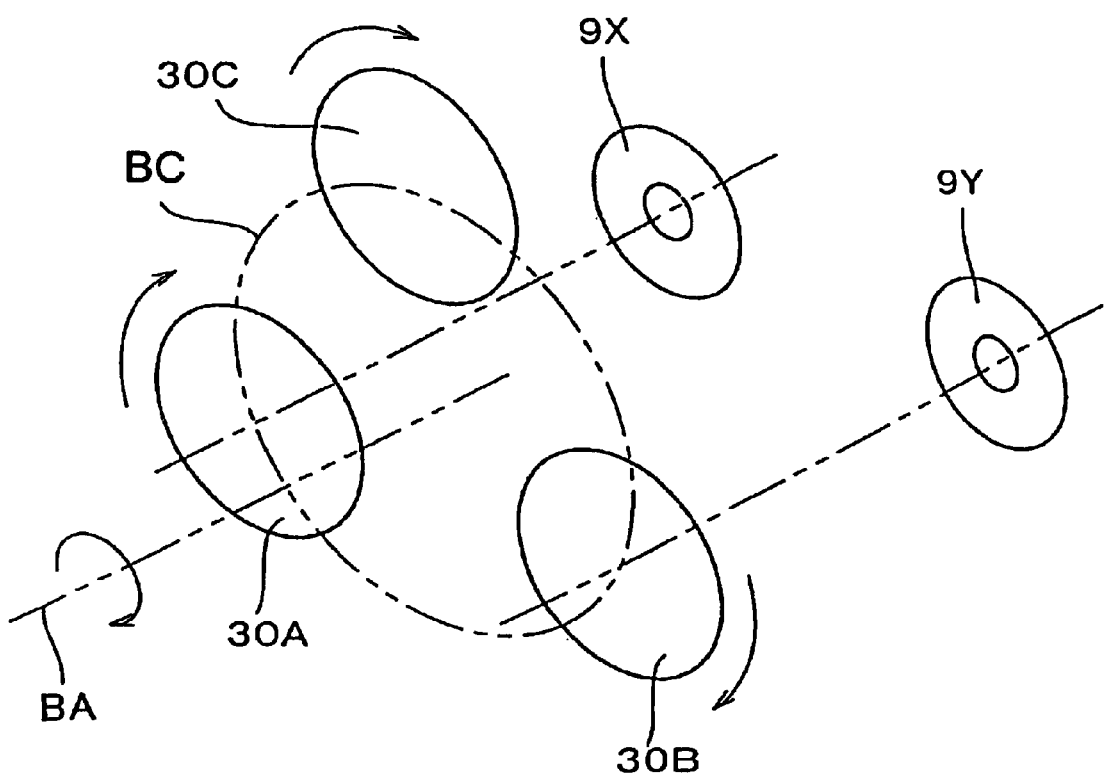
FIG. 12 is a schematic perspective view to show location of each target 30A, 30B, 30C and the substrates 9X, 9Y during the deposition n the apparatus shown in FIG. 11.

FIG. 12 is a schematic perspective view to show location of each target 30A, 30B, 30C and the substrates 9X, 9Y during the depositions in the apparatus shown in FIG. 11. As described, the apparatus of the second embodiment is the stationary face-to-face type. As shown in FIG. 12, during the depositions the substrate holder 90 stands still at the position where the center axes of the substrates 9X, 9Y are in common with two targets 30 respectively.

Following is the description about operation of the apparatus of the second embodiment. For the convenience of the description, three magnet assemblies are 5A, 5B, 5C, and three inside rotary actuators are 54A, 54B, 54C. The substrate holder 90 holding the substrates 9 is moved into the deposition chamber 1, and stopped at the position shown in FIG. 12. In this state, the source 4A for the target 30A facing to the substrate 9X is operated first, depositing the layer La on the substrate 9X. Other sources 4B, 4C are not operated. During this deposition, the magnet assembly 5A behind the target 30A is rotated by the inside rotary actuator 54A.

When the required deposition time elapses, operations of the source 4A and the inside rotary actuator 54A are stopped. Then, the main rotation mechanism is operated to rotate the cathode unit 3 at 120 degree. As a result, the target 30B in turn faces coaxially to the substrate 9X. In this state, the source 4B is operated to deposit the layer Lb onto the substrate 9X by the target 30B. During this deposition, the inside rotary actuator 54B is operated to rotate the magnet assembly 5B behind the target 30B. The other sources 4A, 4C and the other inside rotary actuators 54A, 54C are not operated.

When the required deposition time elapses again, operations of the source 4B and the inside rotary actuator 54B are stopped. Then, the main rotation mechanism is operated to rotate the cathode unit 3 at another 120 degree. As a result, the target 30C in turn faces coaxially to the substrate 9X, and the target 30A faces coaxially to the substrate 9Y. In this state, the source 4C and the source 4A are operated to deposit the layer Lc onto the substrate 9X by the target 30C and deposit the layer La onto the substrate 9Y by the target 30A. During these depositions, the inside rotary actuator 54C is operated to rotate the magnet assembly 5C behind the target 30C, and the inside rotary actuator 54A is operated to rotate the magnet assembly 5A behind the target 30A. The other source 4B and the other inside rotary actuator 54B are not operated.

When the required deposition time elapses again, operations of the source 4C, 4A and the inside rotary actuators 54C, 54A are stopped. Then, the main rotation mechanism is operated to rotate the cathode unit 3 at another 120 degree. As a result, the target 30B in turn faces coaxially to the substrate 9Y. In this state, the source 4B is operated to deposit the layer Lb onto the substrate 9Y by the target 30B. During this deposition, the inside rotary actuator 54B is operated to rotate the magnet assembly 5B behind the target 30B. The other sources 4A, 4C and the other inside rotary actuators 54A, 54C are not operated.

When the required deposition time elapses again, operations of the source 4B and the inside rotary actuator 54B are stopped. Then, the main rotation mechanism is operated to rotate the cathode unit 3 at another 120 degree. As a result, the target 30C in turn faces coaxially to the substrate 9Y. In this state, the source 4C is operated to deposit the layer Lc onto the substrate 9Y by the target 30C. During this deposition, the inside rotary actuator 54C is operated to rotate the magnet assembly 5C behind the target 30C. The other sources 4A, 4B and the other inside rotary actuators 54A, 54B are not operated. When the required deposition time elapses again, all depositions onto two substrates 9X, 9Y are completed. After the substrate holder 90 is moved out of the deposition chamber 1, the cathode unit 3 is rotated at another 240 degree, or −120 degree, to resume the original posture by the time the next substrate holder 90 is moved in.

Because the targets 30A, 30B, 30C are stationary and face coaxially to the substrates 9X, 9Y, the apparatus of the second embodiment is superior in controllability on the deposition conditions, compared to the first embodiment that is the continuous rotation type. Because the magnet assemblies 5A, 5B, 5C are rotated while the targets 30A, 30B, 30C are stationary, the effect of the erosion uniformity can be obtained as well. Though the inside rotary actuators 54A, 54B, 54C are provided behind the magnet assemblies 5A, 5B, 5C respectively, it is still possible to spin all the magnet assemblies 5A, 5B, 5C by one rotary actuator. For example, the same driven gear 361 and the stationary gear 362 as in the first embodiment are provided. And, another rotary actuator is provided in addition to the rotary actuator 351. Then, the stationary gear 362 is rotated by the additional rotary actuator, thereby spinning each magnet assembly 5 simultaneously via the stationary gear 362 and the driven gear 361. During this spinning, the rotary actuator 351 generates the reverse torque for preventing the main holder 31 from being rotated.

The invention is not limited to that the substrate holder 90 holds a couple of the substrates 9 simultaneously. It may hold only one substrate 9, or three or more substrates 9 simultaneously. In the case that the substrate holder 90 holds three substrates 9, it is preferable that each substrate 9 is held apart at every 120 degree. The described operations of the apparatuses have the period when one of the sputter power sources 4 is in idle state. However, depending on process contents of the multilayer film deposition, there may be no idle state of the sputter power sources 4, otherwise may be a shorter period of the idle state.

The invention is not limited to that the same number of the sputter power sources 4 as the targets 30. One sputter power source may be commonly used for the plural targets. Therefore, one sputter power source is enough for the invention. Furthermore, this invention is not limited to the inline type apparatuses. The apparatus of this invention may be one of the so-called cluster-tool type apparatuses.

The described multilayer film deposition apparatuses can be used for manufacturing large scale integrated circuits (LSI), liquid crystal displays (LCD), plasma displays and the like in addition to the magnetic recording media.

In the manufactures of magnetic recording media and magnetic heads, a multilayer film having so-called interlayer-coupling structure is sometimes deposited. The apparatuses of the described embodiments can be applied to this use. For example, in magnetic recording media (including longitudinal recording), thermal fluctuation is the critical problem to be solved. For this purpose, it is sometimes required to expand physical volume of a magnetic recording layer, as it were apparently thinned. Specifically, it may employ a multilayer film of the structure where many layers of magnetic material (e.g. CoCr) are laminated inserting a layer of such material as ruthenium (Ru). In this example, the top CoCr layer is magnetized a little more intensely than other CoCr layers, and each of the other CoCr layers is made interlayer-anti-ferromagnetism-coupled via each Ru layer. Because whole volume as the magnetic recording layer can be gained by the interlayer-anti-ferromagnetism-coupled multi-CoCr film, the problem of thermal fluctuation can be solved. The described apparatuses can be used effectively for depositing such an interlayer-coupled multilayer film.

Figure 13:
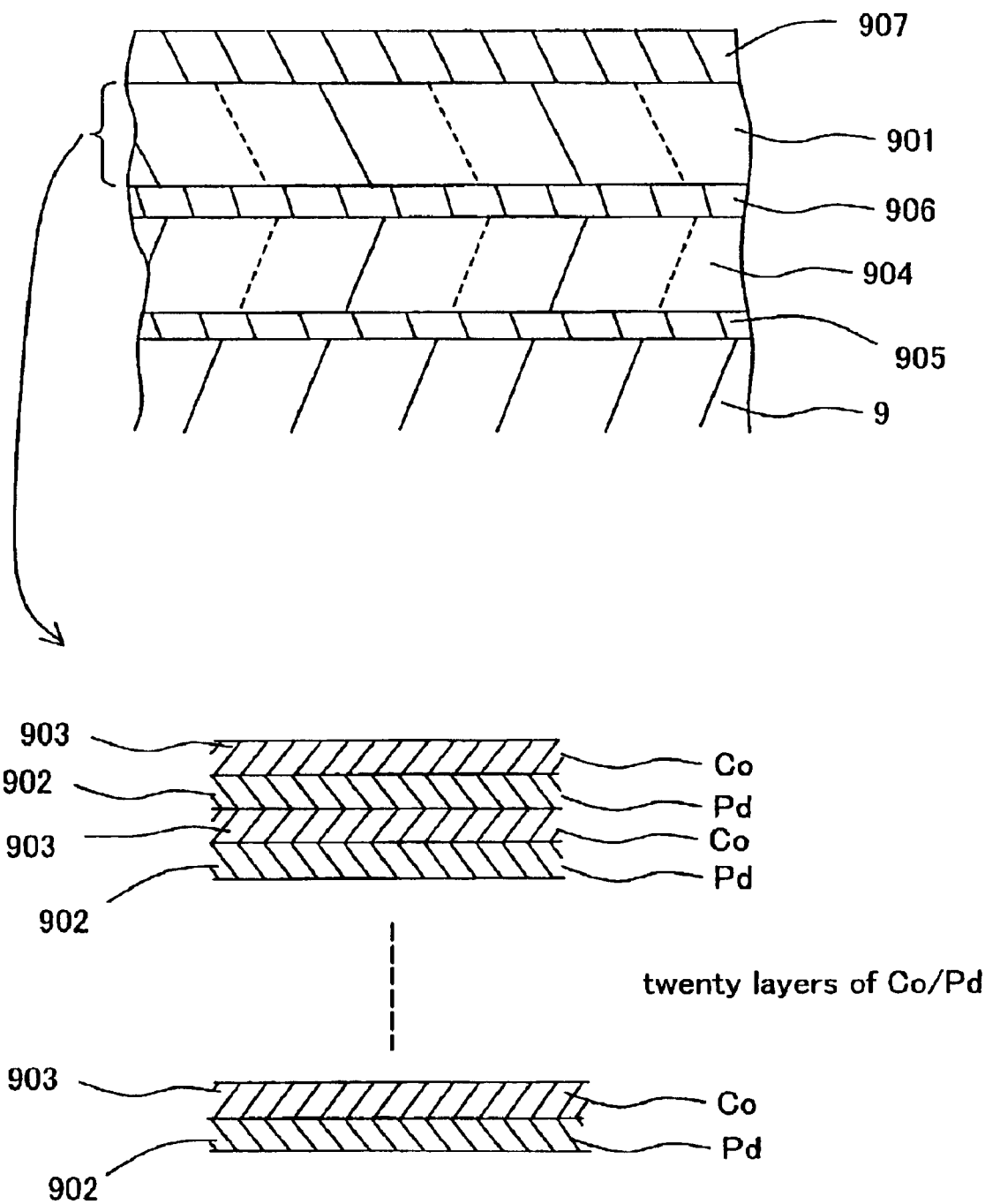
FIG. 13 is a schematic side cross sectional view of a perpendicular-magnetic-recording medium manufactured by the method and apparatus of the embodiments of the invention.

Next, the embodiments of the invention concerning to the manufacture of perpendicular-magnetic-recording media will be described. FIG. 13 is a schematic cross sectional view of a perpendicular-magnetic-recording medium manufactured by the method and apparatus of the embodiments of the invention. The perpendicular-magnetic-recording medium shown in FIG. 13 comprises a disk-shaped substrate 9 and a magnetic recording layer formed on the substrate 9. The magnetic recording layer comprises a perpendicular-magnetization film 901. As magnified in FIG. 13, the perpendicular-magnetization film 901 is the lamination where two kinds of layers 902, 903 are laminated alternately.

The laminated two kinds of layers 902, 903 work as so called superlattice. Perpendicular-magnetization films formed of laminated two kinds of layers are generally called "superlattice". Two kinds of layers in the superlattice are very thin, being Monoatomic layers, biatomic layers or the like. The superlattice is capable of establishing the magnetic anisotropy that coercive force is higher in the laminating direction, i.e. direction to the film thickness. The reason of this is supposedly that magnetic moment along the interlayer direction is higher than that along directions on layer surfaces, resulting from the exchange mutual function of grains in a intermediate layer and other grains in upper and lower layers sandwiching the intermediate layer. The perpendicular-magnetization films by the superlattice are highly expected for perpendicular-recording-media, because of the higher perpendicular-magnetic-anisotropy and the larger square-loop-hysteresis-ratio.

What have been known as the superlattice for the perpendicular-magnetic-recording media are, for example, the alternate lamination of Co layers and Pd layers shown in FIG. 13, the alternate lamination of Co layers and Pt layers, and the like. Instead of Co layers, Co series layers (i.e. cobalt alloy layers or cobalt compound layers) such as CoB layers, or Fe layers or Fe series layers may be adopted. Anyway, to form a high-quality perpendicular-magnetization film of strong perpendicular-magnetic-anisotropy, it is preferable to laminate as many layers as possible, thinning each layer.

As shown in FIG. 13, a backing layer 904 is comprised between the substrate 9 and the perpendicular-magnetization layer 901. The backing layer 904 is comprised for controlling magnetic field by a magnetic head in data recording. The backing layer 904 is to make the field more perpendicular in the perpendicular-magnetization layer 901. Underlying layers 905, 906 are comprised between the substrate 9 and the backing layer 904, and between the backing layer 904 and the perpendicular-magnetization layer 901. The underlying layers 905, 906 are called "seed layers", which are to control crytallinities and orientation properties of the backing layer 904 and the perpendicular-magnetization layer 901. Over the perpendicular-magnetization layer 901, an overcoat 907 is formed.

The perpendicular-magnetic-recording medium can be manufactured by using any described multilayer film deposition apparatuses. In other words, the described multilayer film deposition apparatuses are, on the other hand, the embodiments of perpendicular-magnetic-recording media manufacturing apparatuses of the invention. Following is the description about the operation in case that the described apparatuses are used for the perpendicular-magnetic-recording manufacture. Two kinds of the layers 902, 903 hereinafter called "the first layer 902" and "the second layer 903" respectively. In FIG. 9, supposedly the target 30A is for the first layer 902, the target 30B is for the second layer 903, and the target 30C is for the first layer 902.

The first layer 902 is deposited onto the substrate 9X by the target 30A as the cathode unit 3 is rotated. Continuing rotation of the cathode unit 3, the second layer 903 is deposited onto the substrate 9X, and the first layer 902 is deposited on the substrate 9X by the target 30c. Not completing with this, as rotation of the cathode unit 3 is continued, deposition of the first layer 902 and deposition of the second layer 903 are carried out alternately. Basically the same steps are repeated onto the other substrate 9Y. In this operation, because the first layer 902 is deposited by the target 30A and the target 30C, such coordination as making the outputs of the sources 4A, 4C lower than the source 4B is preferably carried out so that the adequate layer thickness can be obtained.

The superlattice is formed by alternately laminating the required number of the first layer 902 and the second layer 903. In the above operation, soon after depositing the first layer 902, the second layer 903 is deposited in the same deposition chamber 1 without motion to transfer the substrates 9. This point brings several important advantages. One is the high productivity because of no transfer motion. Another one is the downsizing of occupation space of the apparatus, because of no necessity of transfer means. Another one is that the problem of the interlayer contamination can be prevented effectively, because the substrates 9 are not taken out of the deposition chamber 1 at each interval between the depositions. Especially, because the perpendicular-magnetization layer of the superlattice utilizes the interlayer exchange interaction, the interlayer contamination brings the problem to decrease the perpendicular magnetic anisotropy or deteriorate the magnetic property. The described embodiment is free from these problems. Moreover, the partition member 39 and the shield 391 prevent the targets 30 from the cross contamination and prevent the sputtering-particles from mingling. These points as well contribute to forming the high-property superlattice.

In the described embodiment, the targets 30A, 30C were for the first layer 902, and the target 30B was for the second layer 903. However, even two targets can be helpful, one for the layer 902 and the other one for the layer 903. In case of three targets, one of them may be idle while the other two work for the depositions. Otherwise, providing four targets, two of them may be for the first layer 902 and the other two of them may be for the second layer 903.

What is claimed is:

1. A multilayer film deposition apparatus comprising:
   a substrate holder for holding at least one substrate at a position within a predetermined area;
   a vacuum chamber for retaining the substrate holder and performing sputtering to deposit a film onto said substrate held by said substrate holder;
   a plurality of cathodes with targets disposed in the vacuum chamber for generating sputter discharge;
   at least one sputter power source for applying voltage to the plurality of said cathodes; and
   a main rotation mechanism for rotating the plurality of the targets along a circle, a center axis of the substrate held by the substrate holder being substantially located on the circle so that the plurality of the targets moves over the predetermined area where the at least one substrate held by the substrate holder is located, said predetermined area being defined by a locus of one of the plurality of the targets near a center axis of the circle and a locus thereof away from the axis.

2. A multilayer film deposition apparatus as claimed in claim 1, wherein said targets and said main rotation mechanism are provided at opposite sides of said substrate.

3. A multilayer film deposition apparatus as claimed in claim 1, wherein said main rotation mechanism continually rotates said cathodes without making said cathodes stationary when the film is deposited on the substrate.

4. A multilayer film deposition apparatus as claimed in claim 1, wherein said main rotation mechanism stops rotation of the plurality of the targets so that one of the plurality of the targets faces said substrate while the center of the one of the plurality of the targets aligns with the center of the substrate when the film is deposited on the substrate.

5. A multilayer film deposition apparatus as claimed in claim 1, further comprising; a partition member disposed between the plurality of the targets for blocking sputter-particles released from at least one of said targets so as not to mingle with other sputter-particles released from others of said targets.

6. A multilayer film deposition apparatus as claimed in claim 1, further comprising; a shield disposed between the plurality of said targets and the plurality of said substrates and having at least one opening with a size substantially same as that of said substrate so that said substrate faces one of said targets through said opening.

7. A multilayer film deposition apparatus as claimed in claim 1, wherein said substrate holder holds a plurality of said substrates, and the deposition is carried out onto each of said substrates held by said substrate holder in said deposition chamber.

8. A multilayer film deposition apparatus as claimed in claim 1, further comprising; a power-supply line including said sputter power source for controlling the voltage supplied to each of the plurality of the targets independently.

9. A multilayer film deposition apparatus as claimed in claim 1, wherein each of the plurality of the cathodes includes a magnet assembly for magnetron sputtering discharge, said main rotation mechanism rotating said magnet assemblies together with said targets.

10. A multilayer film deposition apparatus as claimed in claim 9, further comprising an auxiliary rotation mechanism for rotating each of the magnetic assemblies around each of the plurality of the targets, each of said magnetic assemblies generating a magnetic field asymmetric relative to a center of each of the plurality of the targets.

11. A multilayer film deposition apparatus as claimed in claim 10, wherein said auxiliary rotation mechanism rotates said magnetic assemblies by a driving force of said main rotation mechanism.

12. A multilayer film deposition apparatus as claimed in claim 10, wherein said auxiliary rotation mechanism rotates said magnetic assemblies independently from said main rotation mechanism.

13. A multilayer film deposition apparatus comprising:
a substrate holder for holding at least one substrate at a position within a predetermined area;
a vacuum chamber for retaining the substrate holder and performing sputtering to deposit a film onto said substrate held by said substrate holder;
a plurality of cathodes with targets disposed in the vacuum chamber for generating sputter discharge;
at least one sputter power source for applying voltage to the plurality of said cathodes; and
a main rotation mechanism for rotating the plurality of the targets along a circle, said plurality of the targets all moving over and completely covering the predetermined area where the at least one substrate held by the substrate holder is located, said predetermined area being defined by a locus of one of the plurality of the targets near a center axis of the circle and a locus thereof away from the axis.

14. A multilayer film deposition apparatus as claimed in claim 13, wherein said substrate holder holds a plurality of substrates, said plurality of the substrates being located in the predetermined area so that when the plurality of the targets are moved along the circle, the plurality of the targets are located over the plurality of the substrates.

15. A method for manufacturing perpendicular-magnetic-recording-media having a first layer and a second layer, comprising:

holding at least one substrate in a vacuum chamber by a substrate holder;
positioning a first target adjacent to the at least one substrate;
depositing the first layer onto the at least one substrate in the vacuum chamber through sputtering from the first target;
rotating the first target and a second target along a circle where a center axis of the at least one substrate is substantially located so that the first target moves away from the at least one substrate and the second target is situated adjacent to the at least one substrate; and
depositing the second layer on the first layer in the vacuum chamber through sputtering from the second target, thereby laminating two kinds of the layers.

16. A method for manufacturing perpendicular-magnetic-recording-media as claimed in claim 15, wherein said at least one substrate includes first and second substrates, said first target depositing the first layer on the first substrate and while the first target depositing the first layer on the second substrate, the second target depositing the second layer on the first layer of the first substrate.

17. An apparatus for manufacturing perpendicular-magnetic-recording-media having a first layer and a second layer as magnetic recording layers, comprising:
a substrate holder for holding at least one substrate;
a deposition chamber for retaining the substrate holder and performing sputtering to deposit the first and second layers onto said substrate held by said substrate holder;
a first cathode with a first target provided in said deposition chamber for deposing the first layer;
a second cathode with a second target provided in said deposition chamber for depositing the second layer, said first and second targets being arranged at positions where center axes of the targets are located on a circle; and
a main rotation mechanism for rotating said first and second cathodes with the targets along the circle, a center axis of the substrate held by the substrate holder being located on the circle so that the first and second targets face the substrate by rotation.

18. An apparatus for manufacturing perpendicular-magnetic-recording-media as claimed in claim 17, wherein each of the first and second cathodes includes a magnet assembly for magnetron sputtering discharge, said main rotation mechanism rotating said magnet assemblies together with said first and second targets.

19. An apparatus for manufacturing perpendicular-magnetic-recording-media as claimed in claim 17, further comprising a partition member disposed between the first and second targets for blocking sputter-particles released from one of said first and second targets so as not to mingle with other sputter-particles released from the other of said first and second targets.

20. An apparatus for manufacturing perpendicular-magnetic-recording-media as claimed in claim 17, further comprising a shield disposed between said first and second targets and said substrate and having at least one opening with a size substantially same as that of said substrate so that said substrate faces one of said targets through said opening.

21. An apparatus for manufacturing perpendicular-magnetic-recording-media as claimed in claim 17, further comprising a power-supply line including a sputter power source for controlling a power supplied to each of the first and second targets independently.

* * * * *